United States Patent
Rowlette et al.

(10) Patent No.: US 10,437,033 B2
(45) Date of Patent: *Oct. 8, 2019

(54) MODULATING SPECTROSCOPIC IMAGING SYSTEM USING SUBSTANTIALLY COHERENT ILLUMINATION

(71) Applicant: DAYLIGHT SOLUTIONS, INC., San Diego, CA (US)

(72) Inventors: Jeremy Rowlette, Escondido, CA (US); Edeline Fotheringham, San Diego, CA (US); Justin Kane, San Diego, CA (US); Mark V. Bermal, San Diego, CA (US); David Nichols, Encinitas, CA (US); William Chapman, San Diego, CA (US)

(73) Assignee: DAYLIGHT SOLUTIONS, INC., San Diego, CA (US)

( * ) Notice: Subject to any disclaimer, the term of this patent is extended or adjusted under 35 U.S.C. 154(b) by 105 days.

This patent is subject to a terminal disclaimer.

(21) Appl. No.: 15/840,476

(22) Filed: Dec. 13, 2017

(65) Prior Publication Data

US 2018/0100999 A1 Apr. 12, 2018

Related U.S. Application Data

(63) Continuation-in-part of application No. 15/680,019, filed on Aug. 17, 2017, which is a continuation of (Continued)

(51) Int. Cl.
*G02B 21/00* (2006.01)
*G02B 21/36* (2006.01)
(Continued)

(52) U.S. Cl.
CPC ............ *G02B 21/0072* (2013.01); *G01J 1/00* (2013.01); *G01J 3/021* (2013.01); *G01J 3/10* (2013.01);
(Continued)

(58) Field of Classification Search
None
See application file for complete search history.

(56) References Cited

U.S. PATENT DOCUMENTS

| 3,488,118 A * | 1/1970 | Parrent, Jr. ............... G03C 5/02 |
| | | 355/2 |
| 4,310,852 A * | 1/1982 | Tricoles .................... G01S 5/04 |
| | | 348/162 |

(Continued)

FOREIGN PATENT DOCUMENTS

| WO | WO2014209471 A2 | 12/2014 |
| WO | WO2016007925 A1 | 1/2016 |
| WO | WO2016177897 A1 | 11/2016 |

OTHER PUBLICATIONS

International Search Report and Written Opinion of the ISA dated Mar. 19, 2018, for PCT/US2017/066157.

(Continued)

*Primary Examiner* — Tyler W. Sullivan
(74) *Attorney, Agent, or Firm* — Roeder & Broder LLP; Steven G. Roeder

(57) ABSTRACT

A spectral imaging device (12) for generating an image (13A) of a sample (10) includes (i) an image sensor (30); (ii) a tunable light source (14) that generates an illumination beam (16) that is directed at the sample (10); (iii) an optical assembly (22) that collects light from the sample (10) and forms an image of the sample (10) on the image sensor (30); and (iv) a control system (32) that controls the tunable light source (14) and the image sensor (30). During a time segment, the control system (32) (i) controls the tunable light source (14) so that the illumination beam (16) has a center wavenumber that is modulated through a first target wavenumber with a first modulation rate; and (ii) controls the image sensor (30) to capture at least one first image at a (Continued)

first frame rate. Further, the first modulation rate is equal to or greater than the first frame rate.

20 Claims, 12 Drawing Sheets

Related U.S. Application Data application No. 15/109,570, filed as application No. PCT/US2015/011884 on Jan. 18, 2015, now Pat. No. 9,784,958.

(60) Provisional application No. 62/433,564, filed on Dec. 13, 2016, provisional application No. 61/929,050, filed on Jan. 18, 2014.

(51) Int. Cl.

| | |
|---|---|
| *G01J 3/28* | (2006.01) |
| *G01J 3/12* | (2006.01) |
| *G01J 3/02* | (2006.01) |
| *G01J 1/00* | (2006.01) |
| *G02B 21/08* | (2006.01) |
| *G01J 3/10* | (2006.01) |
| *G01J 3/433* | (2006.01) |
| *H01S 5/14* | (2006.01) |

(52) U.S. Cl.
CPC ............ *G01J 3/2803* (2013.01); *G01J 3/4338* (2013.01); *G02B 21/0032* (2013.01); *G02B 21/0056* (2013.01); *G02B 21/0064* (2013.01); *G02B 21/088* (2013.01); *G02B 21/367* (2013.01); *G01J 2003/1226* (2013.01); *G01J 2003/1273* (2013.01); *G01J 2003/2826* (2013.01); *G01J 2003/4332* (2013.01); *G01J 2003/4334* (2013.01); *H01S 5/141* (2013.01)

(56) References Cited

U.S. PATENT DOCUMENTS

| | | | | |
|---|---|---|---|---|
| 6,792,010 | B2* | 9/2004 | Koulikov | H01S 5/141 |
| | | | | 372/102 |
| 7,050,215 | B1 | 5/2006 | Johnson | |
| 7,599,055 | B2 | 10/2009 | Gollier et al. | |
| 8,534,838 | B2 | 9/2013 | Barth et al. | |
| 8,598,552 | B1* | 12/2013 | Frihauf | G03F 7/70033 |
| | | | | 250/504 R |
| 9,625,836 | B2 | 4/2017 | Yamaguchi | |
| 2002/0195496 | A1* | 12/2002 | Tsikos | B82Y 15/00 |
| | | | | 235/462.01 |
| 2005/0041113 | A1 | 2/2005 | Nayar | |
| 2005/0201660 | A1* | 9/2005 | Grot | B82Y 20/00 |
| | | | | 385/12 |
| 2005/0219469 | A1* | 10/2005 | Chan | H04B 10/50 |
| | | | | 353/31 |
| 2006/0113386 | A1* | 6/2006 | Olmstead | G06K 7/10732 |
| | | | | 235/454 |
| 2006/0227316 | A1* | 10/2006 | Gatt | G01S 7/4811 |
| | | | | 356/5.09 |
| 2006/0251133 | A1 | 11/2006 | Tojo | |
| 2007/0187616 | A1* | 8/2007 | Burroughs | G02B 26/101 |
| | | | | 250/458.1 |
| 2008/0018906 | A1* | 1/2008 | Kurokawa | A61B 5/0066 |
| | | | | 356/479 |
| 2008/0074660 | A1* | 3/2008 | Ye | G01J 3/26 |
| | | | | 356/300 |
| 2008/0100510 | A1* | 5/2008 | Bonthron | G01S 7/024 |
| | | | | 342/373 |
| 2008/0204760 | A1 | 8/2008 | Gollier et al. | |
| 2009/0073453 | A1* | 3/2009 | Hasegawa | A61B 5/0059 |
| | | | | 356/477 |
| 2010/0111122 | A1* | 5/2010 | Pushkarsky | H01S 5/4012 |
| | | | | 372/32 |
| 2010/0185067 | A1* | 7/2010 | Gupta | A61B 5/0097 |
| | | | | 600/323 |
| 2010/0225924 | A1* | 9/2010 | Kuramoto | G01B 9/02003 |
| | | | | 356/487 |
| 2011/0051118 | A1* | 3/2011 | Sato | G01S 7/491 |
| | | | | 356/4.07 |
| 2011/0235045 | A1* | 9/2011 | Koerner | G02B 21/0056 |
| | | | | 356/451 |
| 2012/0046668 | A1* | 2/2012 | Gantes | A61C 1/084 |
| | | | | 606/130 |
| 2012/0287418 | A1* | 11/2012 | Scherer | G01N 21/61 |
| | | | | 356/51 |
| 2013/0088723 | A1* | 4/2013 | Feldkhun | G01B 9/02082 |
| | | | | 356/498 |
| 2013/0296710 | A1 | 11/2013 | Zuzak et al. | |
| 2013/0343632 | A1* | 12/2013 | Urano | G06T 7/001 |
| | | | | 382/149 |
| 2014/0253714 | A1 | 9/2014 | Weida et al. | |
| 2015/0051498 | A1* | 2/2015 | Darty | A61B 5/447 |
| | | | | 600/477 |
| 2015/0168125 | A1* | 6/2015 | Arieli | A61B 3/102 |
| | | | | 351/211 |
| 2015/0345906 | A1* | 12/2015 | Varshneya | F41G 3/06 |
| | | | | 235/404 |
| 2015/0351722 | A1 | 12/2015 | Chen | |
| 2016/0169747 | A1 | 6/2016 | Weida | |
| 2016/0209271 | A1 | 7/2016 | Rowlette | |
| 2016/0360074 | A1* | 12/2016 | Winer | H04N 5/2353 |
| 2017/0031319 | A1* | 2/2017 | Bronner | G03H 1/0465 |
| 2017/0042428 | A1* | 2/2017 | Kellnberger | A61B 5/7228 |
| 2017/0343695 | A1* | 11/2017 | Stetson | G01V 3/101 |
| 2018/0283946 | A1* | 10/2018 | Rowlette | G01J 3/2823 |

OTHER PUBLICATIONS

Andersson Mats et al, "Flexible lock-in detection system based on synchronized computer plug-in boards applied in sensitive gas spectroscopy", Review of Scientific Instruments, AIP, Melville, NY, US, vol. 79, No. 11, Nov. 26, 2007.
Chow, J et al., "Laser frequency-noise-limited ultrahigh resolution remote fiber sensing", Opt. Express vol. 14, No. 11, May 29, 2006, [online], [retrieved on Mar. 25, 2014]. Retrieved from the Internet: <URL: https://digitalcollections.anu.edu.au/bitstream/10440/381/1/Chow_Laser2006.pdf>;page 4621.
The International Search Report and Written Opinion of the International Searching Authority for PCT/US2015/011884, Daylight Solutions, Inc., dated Apr. 20, 2015 (related application).
The International Preliminary Report on Patentability issued by the International Bureau on behalf of the International Searching Authority for PCT/US2015/011884, Daylight Solutions, Inc., dated Jul. 19, 2016 (related application).
Extended European Search Report issued by the EPO for application No. 15737504.9, Daylight Solutions, Inc. dated Aug. 8, 2017 (related application).
Francesca Rosi et al, "Noninvasive Analysis of Paintings by Mid-infrared Hyperspectral Imaging", Angewandte Chemie International Edition, vol. 52, No. 20, May 10, 2013 (May 10, 2013), pp. 5258-5261, XP055216492, ISSN: 1433-7851, DOI: 10.1002/anie.201209929 * "Experimental section"; figure 1 *.
Phillips Mark C et al, "Hyperspectral microscopy of explosives particles using an external cavity quantum cascade laser", Optical Engineering, Soc. of Photo-Optical Instrumentation Engineers, Bellingham, vol. 52, No. 6, Jun. 1, 2013 (Jun. 1, 2013), p. 61302, XP060025845, ISSN: 0091-3296, DOI: 10.1117/1.OE.52.6.061302 [retrieved on Dec. 26, 2012] * figure 1 ** p. 3, left-hand column*.
Nikodem Michal et al, "Remote mid-infrared sensing using chirped laser dispersion spectroscopy", Advanced Enviornmental, Chemical, and Biological Sensing Technologies VIII, SPIE, 1000 20th St. Bellingham WA 98225-6705 USA, vol. 8024, No. 1, May 13, 2011 (May 13, 2011), p. 1-7, XP060016791, DOI: 10.1117/12.883598 [retrieved on Jan. 1, 1901] *Section "Noise performance in CLaDS"*.

(56) References Cited

OTHER PUBLICATIONS

Matthew R. Kole et al.: "Discrete Frequency Infrared Microspectroscopy and Imaging with a Tunable Quantum Cascade Laser", Analytical Chemistry, vol. 84, No. 23, Dec. 4, 2012, pp. 10366-10372.
Lowenthal S. et al.: "Speckle Removal by a Slowly Moving Diffuser Associated with a Motionless Diffuser", Journal of.
Frank Fuchs et al.: "Imaging Stand-off Detection of Explosives Using Tunable MIR Quantum Cascade Lasers", Optical Sensing II, vol. 7608, Jan. 23, 2010, p. 760809.

\* cited by examiner

MODULATING SPECTROSCOPIC IMAGING SYSTEM USING SUBSTANTIALLY COHERENT ILLUMINATION

RELATED APPLICATIONS

This application claims priority on U.S. Provisional Application No. 62/433,564 filed on Dec. 13, 2016 and entitled "MODULATING SPECTROSCOPIC IMAGING SYSTEM USING SUBSTANTIALLY COHERENT ILLUMINATION". As far as permitted, the contents of U.S. Provisional Application Ser. No. 62/433,564 are incorporated herein by reference.

This application is a continuation-in-part of U.S. patent application Ser. No. 15/680,019, filed on Aug. 17, 2017 and entitled "LOW-NOISE SPECTROSCOPIC IMAGING SYSTEM USING SUBSTANTIALLY COHERENT ILLUMINATION". U.S. patent application Ser. No. 15/680,019 is a continuation application of U.S. Pat. No. 9,784,958 that issued on Oct. 10, 2017, and entitled "LOW-NOISE SPECTROSCOPIC IMAGING SYSTEM USING SUBSTANTIALLY COHERENT ILLUMINATION". U.S. Pat. No. 9,784,958 is a 371 of PCT Patent Application No. PCT/US2015/011884 filed on Jan. 18, 2015 and entitled "LOW-NOISE SPECTROSCOPIC IMAGING SYSTEM USING SUBSTANTIALLY COHERENT ILLUMINATION". PCT Patent Application No. PCT/US2015/011884 claims benefit of U.S. Provisional Application No. 61/929,050 filed on Jan. 18, 2014. As far as permitted, the contents of U.S. Provisional application Ser. No. 15/680,019; U.S. Pat. No. 9,784,958; PCT Patent Application No. PCT/US2015/011884; and U.S. Provisional Application No. 61/929,050 are incorporated herein by reference.

BACKGROUND

Microscopes are often used to analyze a sample in order to evaluate certain details and/or properties of the sample that would not otherwise be visible to the naked eye. Additional information on the chemical properties of the sample can be obtained by capturing spectral images of the sample while illuminating the sample with discrete optical frequencies of monochromatic laser radiation. Samples that can be analyzed this way include human tissue and cells, explosive residues, powders, liquids, solids, polymers, inks, and other materials. For example, a human tissue sample may be analyzed for the presence of cancerous cells and/or other health related conditions.

There is a never ending desire to improve the resolution and quality of the spectral images of the samples that are being generated.

SUMMARY

The present invention is directed toward a spectral imaging device for generating an image of a sample. In one embodiment, the spectral imaging device includes (i) an image sensor that captures information of an image; (ii) a tunable light source that generates an illumination beam that is directed at the sample; (iii) an optical assembly that collects light from the sample and forms an image of the sample on the image sensor; and (iv) a control system that controls the tunable light source and the image sensor. In one embodiment, during a first time segment, the control system (i) controls the tunable light source so that the illumination beam includes a first beam set in which a center wavenumber of the illumination beam is modulated through a first target wavenumber with a first modulation rate; and (ii) controls the image sensor to capture at least one first image at a first frame rate.

In certain embodiments, the first modulation rate is equal to or greater than the first frame rate. For example, the first modulation rate can be greater than the first frame rate. This minimizes the peak-to-peak interference patterns of the spectral imaging device, and thereby reduces the influences of coherence noise sources of the spectral imaging device associated with standing wave or multiple beam physics in order to substantially improve the quality of each image and increase the data acquisition speed or throughput of the instrument.

In certain embodiments, tunable light source emits a temporally coherent illumination beam and the desired tuning range is the mid-infrared range.

Further, in certain embodiments, the first modulation rate is approximately an integer multiple of the first frame rate.

In one embodiment, during a second time segment that is different from the first time segment, the control system can (i) control the tunable light source so that the illumination beam includes a second beam set in which the center wavenumber of the illumination beam is modulated through a second target wavenumber with a second modulation rate; and (ii) control the image sensor to capture at least one, second image at a second frame rate; wherein the second modulation rate is approximately an integer multiple of the second frame rate; and wherein the second target wavenumber is different from the first target wavenumber.

Further, during a third time segment that is different from the first time segment and the second time segment, the control system can (i) control the tunable light source so that the illumination beam includes a third beam set in which the center wavenumber of the illumination beam is modulated through a third target wavenumber with a third modulation rate; and (ii) control the image sensor to capture at least one, third image at a third frame rate; wherein the third modulation rate is approximately an integer multiple of the third frame rate; and wherein the third target wavenumber is different from the first target wavenumber and the second target wavenumber.

In certain embodiments, the first target wavenumber and the second target wavenumber are spaced apart a wavenumber step; the first beam set has a first peak-to-trough value, and the second beam set has a second peak-to-trough value; and/or the first peak-to-trough value and the second peak-to-trough value are greater than or equal to fifty percent of the wavenumber step.

Further, during the first time segment period, the control system can control the image sensor to capture at least two, first image.

Additionally, the control system can include a light source clock and an imaging sensor clock. In one embodiment, the light source clock generates a plurality of source signals that are directed to the imaging sensor clock so that the sensor clock is phase locked to the light source clock such that the sensor clock is the slave and the light source clock is the master. In an alternative embodiment, the imaging sensor clock generates a plurality of sensor signals that are directed to the light source clock so that the light source clock is phase locked to the imaging sensor clock such that the light source clock is the slave and the imaging sensor clock is the master.

Additionally, the control system can include a frame grabber that receives at least one first image, and time stamps at least one first image with the time from the light source clock.

In another embodiment, the present invention is directed to a method for generating an image of a sample comprising: (i) capturing information of the image with an image sensor; (ii) directing an illumination beam at the sample with a tunable light source; (iii) collecting light from the sample and forming the image on the image sensor with an optical assembly; (iv) controlling the tunable light source during a first time segment so that the illumination beam includes a first beam set in which a center wavenumber of the illumination beam is modulated through a first target wavenumber with a first modulation rate; and (v) controlling the image sensor to capture at least one first image at a first frame rate during the first time segment; wherein the first modulation rate is equal to or greater than the first frame rate.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
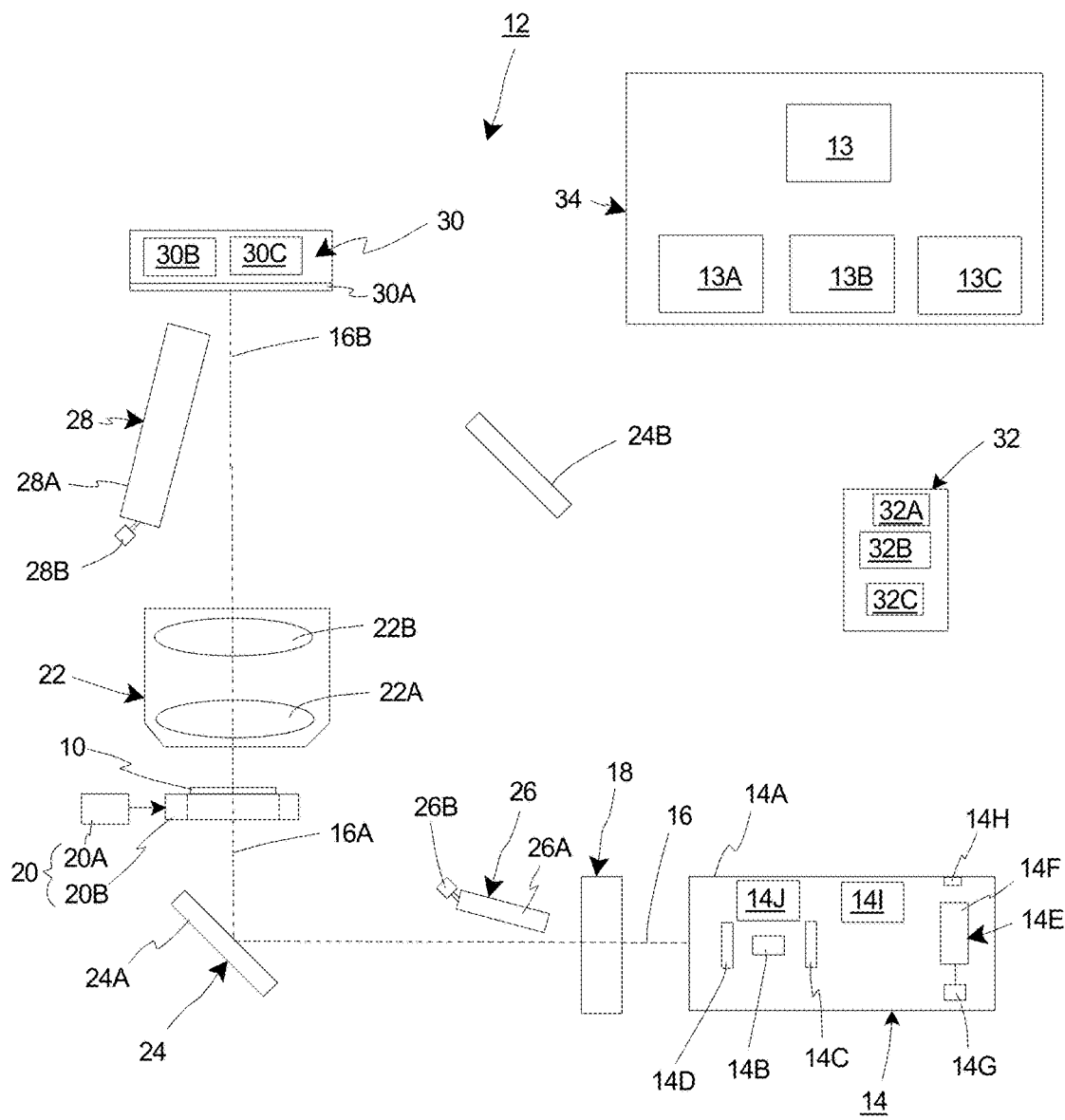
FIG. 1A is a simplified schematic illustration of a spectral imaging microscope, in a transmission mode.
Figure 1B:
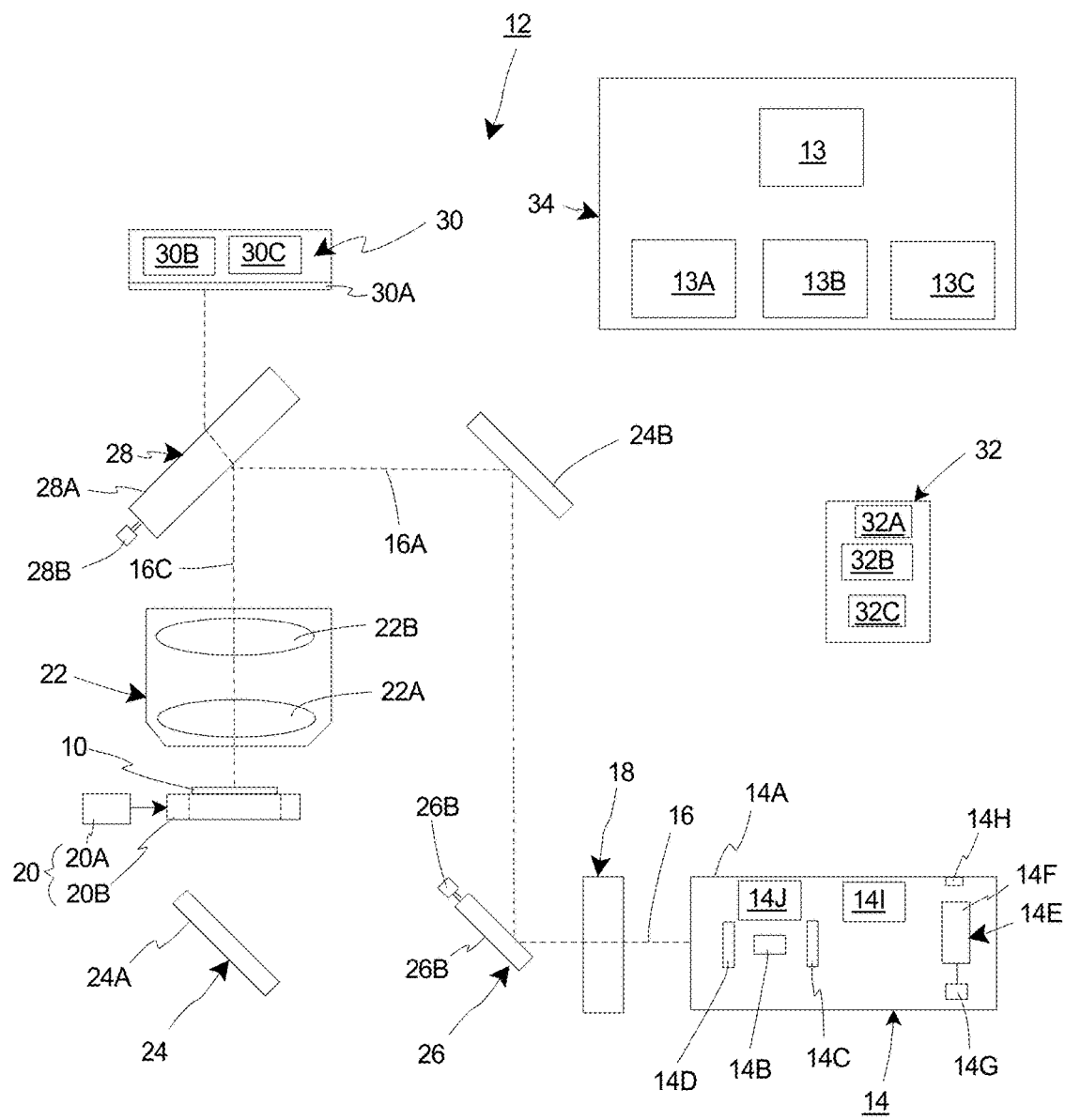
FIG. 1B is a simplified schematic illustration of the spectral imaging microscope of FIG. 1A, in a reflection mode.

FIG. 1A and FIG. 1B are simplified schematic illustrations of a sample 10 and an embodiment of a spectral imaging device 12, e.g., a spectral imaging microscope, having features of the present invention. In FIG. 1A, the spectral imaging device 12 is illustrated in a transmission mode, and in FIG. 1B, the spectral imaging device 12 is illustrated in a reflection mode. In certain embodiments, the spectral imaging device 12 can be used to quickly and accurately acquire a spectral cube 13 (illustrated as a box) of the sample 10 that can be used to analyze and evaluate the various properties of the sample 10. As provided herein, in certain embodiments, the spectral imaging device 12 is uniquely designed to generate a plurality of high resolution, two dimensional, output images 13A, 13B, 13C (only three are illustrated as boxes) of the sample 10 that are used to create the spectral cube 13 for the sample 10. The term "image" as used herein shall mean and include a two-dimensional image or screen display, or a two-dimensional array of data that can be used to generate the two-dimensional image.

It should noted that the number of output images 13A, 13B, 13C used to create the spectral cube 13 can be varied. As non-exclusive examples, the number of output images 13A, 13B, 13C in the spectral cube 13 for each sample area 10 can be approximately 1, 2, 3, 4, 5, 6, 7, 8, 9, 10, 15, 20, 25, 40, 200, 226, 400, 552 or 4000.

The design and/or positioning of components of the spectral imaging device 12 can be varied to achieve the desired characteristics of the spectral imaging device 12. In one embodiment, the spectral imaging device 12 is an infrared spectral imaging microscope that uses tunable, infrared laser radiation to interrogate the sample 10.

In the non-exclusive embodiment illustrated in FIGS. 1A and 1B, the spectral imaging microscope 12 includes (i) a tunable light source 14 that generates and/or emits an illumination beam 16 (illustrated as a dashed line), (ii) an illumination optical assembly 18; (iii) a stage assembly 20 that retains and positions the sample 10; (iv) an objective optical assembly 22, (v) a beam steerer assembly 24 that steers the illumination beam 16 along a desired beam path, (iv) a mode switch 26 that is controlled by a user (not shown) so that the illumination beam 16 can be alternatively directed at the sample 10 in the transmission mode (illustrated in FIG. 1A) or the reflection mode (illustrated in FIG. 1B), (v) a beam splitter 28, (vi) an image sensor 30 that captures information to create the output images ("frames") 13A, 13B, 13C and the spectral cube 13 of the sample 10;

and (vii) a control system 32 that is electrically connected to and controls many of the components of the spectral imaging device 12.

It should be noted that the spectral imaging microscope 12 can be designed with more or fewer components than are illustrated in FIGS. 1A and 1B, and/or the components can be organized in another fashion. For example, the objective optical assembly 22 can include a multiple position lens turret (not shown) that includes one or more mid-infrared objective lens assemblies with different characteristics, and/or one or more objective lens assemblies that work outside the mid-infrared spectral range. Additionally, for example, the spectral imaging microscope 12 can be designed without the illumination optical assembly 18.

Moreover, the spectral imaging device 12 can include an image display 34 (illustrated as a box), e.g. an LED display, that displays one or more of the output images 13A, 13B, 13C in real time, and/or displays the spectral cube 13.

As an overview, as discussed in greater detail herein below, in one embodiment, the control system 32 controls the tunable light source 14 to modulate (dither) the center wavenumber of the illumination beam 16 during the capturing of the information for each output image 13A-13C in order to reduce the temporal coherence of the illumination beam 16. Further, the modulation rate of the illumination beam 16 can be greater than the temporal response limited frame rate of the image sensor 30. Due to the low-pass filtering response characteristic of the image sensor, the peak-to-peak interference patterns of the spectral imaging device 12 shall be reduced. This has the effect of reducing temporal coherence noise of the spectral imaging device 12 associated with standing wave or multiple beam physics in order to substantially improve the quality of each output image 13A, 13B, 13C and increase the data acquisition speed or throughput of the instrument.

As provided herein, the sample 10 can be analyzed and evaluated in a static sense, i.e. where the properties of the sample 10 are substantially unchanged over the measurement period, and/or in a dynamic sense, i.e. where the properties of the sample 10 are evolving over the measurement period. In the static case, a one-dimensional spectra is produced for every pixel position of the two-dimensional output image 13A, 13B, 13C to yield a three-dimensional spectral cube 13. In the dynamic case, a fourth dimension of time is added to yield a four-dimensional spectral matrix 13.

The fidelity of the data of the spectral cube 13 can be characterized by the repeatability of the spectral data at each pixel location, over multiple trials. Each trial has a unique data collection start time. Because the source intensity may vary strongly across the sample 10 as well as across the optical frequency band of interest, one or more featureless background spectral cubes (without the sample) may be generated and used to normalize the signal spectral cube by taking the ratio of the signal spectral cube to the background spectral cube. If the frequencies are collected in an ordered array, then the ratio is referred to as the image transmittance.

As provided herein, a ratio of two background spectral cubes taken without the sample 10, at different times, can be used to produce a system transmittance spectral cube (not shown). Comparing the pixel-by-pixel transmittance over many trials and over optical frequencies is a suitable means for characterizing the intrinsic signal-to-noise ratio (SNR) of the spectral imaging device 12. A non-exclusive example of an acceptable measure of the intrinsic system SNR is the reciprocal of the variance of the transmittance over a specified spectral range for two randomly selected spectral cube collection trials taken at different times.

The sample 10 can be a variety of things, including, but not limited to, mammalian blood, mammalian blood serum, mammalian cells, mammalian tissue, mammalian biofluids, and their animal counterparts, plant matter, bacteria, polymers, hair, fibers, explosive residues, powders, liquids, solids, inks, and other materials commonly analyzed using spectroscopy and microscopy. More particularly, in certain non-exclusive applications, the sample 10 can be human blood serum, and the spectral imaging microscope 12 can be utilized for rapid screening of the serum sample 10 for the presence of disease and/or other health related conditions; and/or the spectral imaging microscope 12 can be utilized in certain forensic applications such as rapid screening of the sample 10 for the presence of explosive residues and/or other dangerous substances. Additionally, when positioned substantially within the spectral imaging microscope 12 for purposes of analysis, the sample 10 can be present by itself, or the sample 10 can be held in place using one or more slides (not shown), e.g., infrared transparent slides.

Further, the sample 10 can be thin enough to allow study through transmission of the illumination beam 16 through the sample 10 (i.e. in transmission mode (illustrated in FIG. 1A)), or the sample 10 can be an optically opaque sample that is analyzed through reflection of the illumination beam 16 by the sample 10 (i.e. in reflection mode (illustrated in FIG. 1B)).

It should be appreciated that the spectral imaging device 12 can be utilized in a variety of potential applications. For example, such applications can include, but are not limited to, spectral histopathology and cytopathology, hematology, pharmaceutical drug development and process control, detection of biochemical warfare agents and other hazardous materials, materials science, and polymer science development.

In certain embodiments, the spectral imaging microscope 12 has a relatively high resolution, high numerical aperture ("NA"), and a relatively large field of view ("FOV"). This allows for the collection of data from relatively large samples. This will improve the speed in which the sample is analyzed. As one non-exclusive example, the spectral imaging microscope 12 can have NA of 0.7, a magnification of 12.5x, and a FOV of approximately 650 µm×650 µm, with a sample-referred pixel size of 1.36 µm.

In one embodiment, the tunable light source 14 includes a laser source that emits a substantially temporally coherent illumination beam 16 (e.g. a laser beam) that is usable for illuminating and analyzing the sample 10 in transmission mode and/or in reflection mode. With this design, the illumination beam 16 is made up of a plurality of illumination rays 16A that follow a beam path from the light source 14 to the sample 10 and from the sample 10 to the image sensor 30. Further, the light source 14 can be controlled by the control system 32 to vary the discrete center wavenumber of the illumination rays 16A over time within the desired tuning range.

In certain non-exclusive embodiments, the tunable light source 14 is a tunable mid-infrared light source that directly generates and emits the illumination beam 16 having a center wavenumber that is in the mid-infrared ("MIR") range. In this example, the desired tuning range is the MIR range. As used herein, the term "MIR range" shall mean and include the spectral region or spectral band of between approximately five thousand to five hundred wavenumbers (5000-500 cm$^{-1}$), or approximately two and twenty micrometers (2-20 µm) in wavelength. The mid-infrared range is particularly useful to spectroscopically interrogate the sample 10 since many samples 10 are comprised of molecules or groups of molecules that have fundamental vibrational modes in the MIR range, and thus present strong, unique absorption signatures within the MIR range. Alternatively, the tunable light source 14 can be designed to generate the illumination beam 16 having a wavenumber that is greater than or less than the MIR range.

Moreover, in alternative embodiments, the tunable light source 14 can be controlled by the control system 32 to be either a pulsed laser or a continuous wave (CW) laser. For a pulsed light source 14, the illumination beam 16 will include the plurality of pulses of illumination rays 16A that follow the beam path from the tunable light source 14 to the sample 10 and from the sample 10 to the image sensor 30. Further, the pulses of illumination rays 16A can have a discrete center wavenumber that is within the MIR range.

In the embodiment illustrated in FIGS. 1A and 1B, the light source 14 is a single, external cavity, Littrow configuration, tunable laser. Alternatively, the light source 14 can include multiple individually tunable lasers that span a portion or all of the desired mid-infrared spectral range. For example, when multiple lasers are used, each laser can generate a different portion of the desired spectral range, with slight overlapping of the wavenumbers generated to allow for calibration of the lasers and better fidelity. A description of a light source 14 that includes multiple individual lasers is described in U.S. Pat. No. 9,086,375, entitled "Laser Source With A Large Spectral Range". As far as permitted, the contents of U.S. Pat. No. 9,086,375 are incorporated herein by reference. The light source 14 can utilize a variety of methods to rapidly switch between the target optical frequencies. These include techniques such as rapid tuning mechanisms, galvo-controlled mirrors to switch between different laser modules, or spectral beam combining techniques of multiple laser modules and subsequent time-division multiplexing of laser illumination.

In the non-exclusive embodiment illustrated in FIGS. 1A and 1B, the light source 14 includes a rigid laser frame 14A, a gain medium 14B, a cavity optical assembly 14C, an output optical assembly 14D, a wavelength selective ("WS") feedback assembly 14E (e.g., a movable grating or an integrated distributed feedback grating with electrically or thermally adjustable index of refraction), a light source controller 14I, and a light source clock 14J.

The design of the gain medium 14B can be varied pursuant to the teachings provided herein. In one, non-exclusive embodiment, the gain medium 14B directly emits the illumination beam 16 without any frequency conversion. As a non-exclusive example, the gain medium 14B can be a semiconductor type laser. More specifically, in certain embodiments, the gain medium 14B is a Quantum Cascade (QC) gain medium, an Interband Cascade (IC) gain medium, or a mid-infrared diode. Alternatively, another type of gain medium 14B can be utilized.

In FIG. 1A, the gain medium 14B includes (i) a first facet that faces the cavity optical assembly 14C and the WS feedback assembly 14E, and (ii) a second facet that faces the output optical assembly 14D. In this embodiment, the gain medium 14B emits from both facets. In one embodiment, the first facet is coated with an anti-reflection ("AR") coating and the second facet is coated with a reflective coating. The AR coating allows light directed from the gain medium 14B at the first facet to easily exit the gain medium 14B as a beam directed at the WS feedback assembly 14E; and allows the beam reflected from the WS feedback assembly 14E to easily enter the gain medium 14B.

The illumination beam 16 exits from the second facet. The reflective coating on the second facet reflects at least some of the light that is directed at the second facet from the gain medium 14B back into the gain medium 14B. In one non-exclusive embodiment, the AR coating can have a reflectivity of less than approximately 2 percent, and the reflective coating can have a reflectivity of between approximately 2-95 percent. In this embodiment, the reflective coating acts as an output coupler (e.g., a first end) for the external cavity.

The cavity optical assembly 14C is positioned between the gain medium 14B and the WS feedback assembly 14E along a lasing axis, and collimates and focuses the light that passes between these components. For example, the cavity optical assembly 14C can include a single lens or more than one lens. For example, the lens can be an aspherical lens having an optical axis that is aligned with the lasing axis. In one embodiment, to achieve the desired small size and portability, the lens has a relatively small diameter. The lens can comprise materials selected from the group of Ge, ZnSe, ZnS, Si, CaF2, BaF2 or chalcogenide glass. However, other materials may also be utilized.

The output optical assembly 14D is positioned along the lasing axis. In this design, the output optical assembly 14D collimates and focuses the illumination beam 16 that exits the second facet of the gain medium 14B. For example, the output optical assembly 14D can include a single lens or more than one lens that are somewhat similar in design to the lens of the cavity optical assembly 14C.

The WS feedback assembly 14E reflects the light back to the gain medium 14B, and is used to precisely select and adjust the lasing frequency (wavelength) of the external cavity and the center optical frequency of the illumination beam 16. Stated in another fashion, the WS feedback assembly 14E is used to feed back to the gain medium 14B a relatively narrow band optical frequency which is then amplified in the gain medium 14B. In this manner, the illumination beam 16 may be tuned with the WS feedback assembly 14E without adjusting the gain medium 14B. Thus, with the external cavity arrangements disclosed herein, the WS feedback assembly 14E dictates what optical frequency will experience the most gain and thus dominate the optical frequency of the illumination beam 16.

A number of alternative embodiments of the WS feedback assembly 14E can be utilized. In FIG. 1A, the WS feedback assembly 14E is spaced apart from the gain medium 14B and defines a second end of the external cavity. In this embodiment, the external cavity extends from the output coupler (reflective coating) on the second facet to the WS feedback assembly 14E.

In one, non-exclusive embodiment, the WS feedback assembly 14E includes a diffraction grating 14G and a grating mover 14H (e.g. a voice coil actuator or other type of actuator) that selectively moves (e.g., rotates) the diffraction grating 14G to adjust the lasing wavenumber of the gain medium 14B and the wavenumber of the illumination beam 16. For example, the grating mover 14H can rapidly pivot the grating angle 14G at a high rate (e.g. 30-1500 hertz) about a nominal angle to produce a range of instantaneous wavelengths about a nominal central wavelength. The diffraction grating 14G can be continuously monitored with a measurement system 14H, e.g. an optical encoder, that provides for closed loop control of the grating mover 14G. With this design, the wavenumber of the illumination beam 16 can be selectively adjusted in a closed loop fashion so that the sample 10 can be imaged at many different, precise, selectively adjustable wavenumbers throughout a portion or the entire MIR range.

The light source controller 14I includes a processor for controlling the operation of the tunable light source 14 including the electrical power to the grating mover 14G, and the electrical power that is directed to the gain medium 14B to control the timing and wavenumber of the illumination beam 16.

The light source clock 14J measures time. The light source clock 14J is used by the light source controller 14I to precisely control the operation of the tunable light source 14. It should be noted that the light source controller 14I and the light source clock 14J can be considered part of the control system 32.

The light source 14 can be calibrated using a wavelength measurement device (not shown) during manufacturing of the light source 14. More specifically, with the light source 14 activated, the grating mover 14G can be used to pivot the grating angle 14F, while monitoring position of the grating 14F with the measurement system 14H, and wavelength of the output pulses with the wavelength measurement device. With this design, each position signal of the measurement system 14H can correspond to a measured center wavelength of the illumination beam.

The control system 32 controls the operation of the tunable light source 14 including the electrical power to the grating mover 14G, and the electrical power that is directed to the gain medium 14B to control the timing and wavenumber of the illumination beam 16. Further, the control system 32 can control the image sensor 30 to control the timing of the capture of the images 13A, 13B, 13C. For example, the control system 32 can include one or more processors 32A (illustrated as a box) and/or electronic storage devices 32B (illustrated as a box). In FIGS. 1A and 1B, the control system 32 is a distributed computing system that includes multiple processors which communicate and coordinate the control of the various components of the spectral imaging device 12. Alternatively, the control system 32 can include a single processor for controlling the various components of the spectral imaging device 12.

The collection of accurate output images 13A-13C requires that the wavenumber of the illumination beam 16 be precisely known as the light source 14 is tuned. In certain embodiments, the control system 32 directs the pulses of power to the gain medium 14B based on the position signal received from the measurement system 14H. As a result thereof, the specific wavenumber of the pulses will not be influenced by variations in speed of the grating mover 14G.

The duration of each laser pulse of power directed by the control system 32 to the gain medium 14B can also be varied. In alternative, non-exclusive embodiments, the control system 32 can control each laser pulse of power to have a duration of approximately 1, 10, 25, 50, 75, 100, 150, 200, 300, 400, 500, 600, 1000 nanoseconds, 10,000 nanoseconds. Furthermore, the laser may be operated in a continuous wave (CW) mode of operation. Still further, an external amplitude modulator such as an electro-optical, acoustic-optical cell to generate and control pulse frequency and duration.

The illumination beam 16 emitted from the tunable light source 14 is directed at the sample 10 to illuminate the sample 10. For example, when the spectral imaging microscope 12 is operating in the transmission mode, the illumination beam 16 includes a plurality of illumination rays 16A that are directed at the bottom of the sample 10. In FIG. 1A, the illumination rays 16A are directed at the sample 10 at approximately zero degree angle, otherwise known as normal incidence. Further, in this example, the illumination rays 16A that are transmitted through the sample 10 are referred to as transmitted rays 16B. In this embodiment, the transmitted rays 16B are collected by the objective optical assembly 22 to create an image on the image sensor 30.

Alternatively, when the spectral imaging microscope 12 is operating in the reflection mode, the illumination beam 16 includes a plurality of illumination rays 16A that are directed at the top of the sample 10. In FIG. 1B, the illumination rays 16A are directed at the sample 10 at approximately zero degrees or normal incidence. Further, in this example, the illumination rays 16A that are reflected from the sample 10 are referred to as reflected rays 16C. In this embodiment, the reflected rays 16C are collected by the objective optical assembly 22 to create an image on the image sensor 30.

The illumination optical assembly 18 transforms, conditions, and/or shapes the profile of the illumination rays 16A that are directed at the sample 10. For example, the illumination optical assembly 18 can increase (magnify) or decrease, the size and profile of the illumination beam 16 to simultaneously illuminate a desired illuminated area on the sample 10. In certain embodiments, the size of the desired illuminated area of the sample 10 is tailored to correspond to the design of the image sensor 30 and the objective optical assembly 22. As non-exclusive examples, the desired illuminated area is circular and has a diameter that is approximately 50, 100, 200, 250, 500, 600, 650, 700, 1000, or by 2000 um. The illumination optical assembly 18 can include one or more optical, refractive elements. Further, in certain embodiments, the refractive elements are operable in the MIR range.

The stage assembly 20 retains and accurately positions the sample 10 during spectral imaging of the sample 10. In one embodiment, the stage assembly 20 includes a stage 20A that retains the sample 10, and a stage mover 20B that includes one or more actuators (not shown) that move or position the sample 10 along and/or about one or more axes. Additionally, the stage assembly 20 can include a stage measurement system (not shown) for closed loop control of the stage assembly 20 by the control system 32.

The objective optical assembly 22 collects the light from a plurality of points on the sample 10, and directs the light on the image sensor 30 to form an image of the sample 10 on the image sensor 30. Stated in another fashion, the objective optical assembly 22 collects the light transmitted through the sample 10 in the transmission mode, and collects the light reflected off of the sample 10 in the reflection mode. The objective optical assembly 22 can have any suitable design depending on the specific requirements of the spectral imaging microscope 12. In one embodiment, the objective optical assembly 22 can include a first refractive element 22A and a spaced apart, second refractive element 22B that cooperate to form an image of the sample 10 on the image sensor 30. Alternatively, the objective optical assembly 22 can include greater than two refractive elements or only one refractive element.

Each of the refractive elements 22A, 22B is operative in the desired tuning range of the spectral imaging device 12 and can be types such as plano-convex, plano-concave, meniscus, and aspherical, as well as other types. For refractive lenses in the MIR range, materials such as Ge, ZnSe, ZnS, Si, CaF, BaF or chalcogenide glass and other materials can be employed. Reflective lenses can be elliptical, paraboloid, or other shapes. The reflective surface can be dichroic coating, Au, Ag, or other surface types.

The beam steerer assembly 24 is utilized to steer the illumination beam 16 along the appropriate path. The design of the beam steerer assembly 24 can be varied. In the non-exclusive embodiment illustrated in FIGS. 1A and 1B, the beam steerer assembly 24 includes a transmission beam steerer 24A that directs the illumination rays 16A at the bottom of the sample 10, and a reflection beam steerer 24B that directs the illumination rays 16A at the top of the sample 10. As a non-exclusive example, each beam steerer 24A, 24B can be a mirror that is reflective in the desired optical frequency spectrum. Furthermore, the beam steerer assembly 24 can be designed to allow for one or more electrically controllable angular adjustments.

The mode switch 26 is used to selectively switch the spectral imaging device 12 between the transmission mode illustrated in FIG. 1A and the reflection mode illustrated in FIG. 1B. In one non-exclusive embodiment, the mode switch 26 includes a switch reflector 26A and a reflector mover 26B that is controlled by the control system 32 to selective move the switch reflector 26A (i) outside the path of the illumination beam 16 for the transmission mode; and (ii) into the path of the illumination beam 16 in the reflection mode.

Moreover, in reflection mode, as illustrated in FIG. 1B, the illumination beam 16 is directed at the top of the sample 10 with the beam splitter 28. The design of the beam splitter 28 can be varied to suit the specific requirements of the spectral imaging microscope 12. In certain embodiments, the beam splitter 28 includes a splitter 28A that redirect a first portion (e.g. fifty percent (50%)) of the illumination rays 16A toward the top of the sample 10, and transmit a second portion (not shown) of the illumination rays 16A. The second portion of the illumination beam 16 is subsequently directed away from the system and not used by the spectral imaging microscope 12. It should be noted that the second (or discarded) portion of the illumination beam 16 that is generated from this first pass through the beam splitter 28 is not shown in FIG. 1A for purposes of clarity. Further, the splitter 28A can transmit a first portion (e.g. fifty percent (50%)) of the reflected rays 16C from the sample 10, and redirects a second portion (not shown) of the reflected rays 16C. In certain embodiments, the splitter 28A can be made from a variety of infrared transmissive materials, such as ZnSe or Ge, or other materials.

With reference to FIGS. 1A and 1B, the beam splitter 28 can include a splitter mover 28B that is controlled by the control system 32 to selective move the splitter 28A (i) outside the path of the transmitted rays 16B for the transmission mode; and (ii) into the path of the illumination rays 16A and the reflected rays 16C in the reflection mode.

The image sensor 30 collects information to construct each image 13A, 13B, 13C. For example, the image sensor 30 can include a single sensor. Alternatively, the image sensor 20 can include a two-dimensional array of sensor pixels 30A that are used to construct a two-dimensional image including the two dimensional array of data (data at each pixel). Additionally, the design of the image sensor 30 can be varied to correspond to the optical frequency range of the illumination beam 16. For example, for a MIR beam 16, the image sensor 30 can be an infrared camera that converts the infrared light into an array of electronic signals that represents an image of the sample. Stated in another fashion, if the illumination beam 16 is in the MIR range, the image sensor 30 can be a MIR imager. More specifically, if the illumination beam 16 is in the infrared spectral region from two to twenty μm, the image sensor 30 is sensitive to the infrared spectral region from two to twenty μm.

Non-exclusive examples of suitable infrared image sensors 28 include (i) vanadium oxide ($VO_x$) and amorphous silicon microbolometer arrays such as the FPA in the FLIR Tau 640 infrared camera that are typically responsive in the seven to fourteen μm spectral range; (ii) mercury cadmium telluride (HgCdTe or MCT) arrays such as those in the FLIR Orion SC7000 Series cameras that are responsive in the 7.7 to 11.5 μm spectral range; (iii) indium antimonide (InSb) arrays such as those in the FLIR Orion SC7000 Series cameras that are responsive in the 1.5 to 5.5 μm spectral range; (iv) indium gallium arsenide (InGaAs); (v) uncooled hybrid arrays involving $VO_x$ and other materials from DRS that are responsive in the two to twenty μm spectral range; or (vi) any other type of image sensor that is designed to be sensitive to infrared light in the two to twenty μm range and has electronics allowing reading out of each element's signal level to generate a two-dimensional array of image information (data).

In one specific embodiment, the image sensor 30 is a microbolometer that includes a two-dimensional array of photosensitive elements (pixels) 30A that are sensitive to the optical frequency of the illumination beam 16. The spacing between the pixel elements is referred to as the pitch of the array. As non-exclusive examples, the two-dimensional array can include approximately 640×480; 320×240; 480×480; 80×60; 1080×720; 120×120; 240×240; or 480×640 pixels. It should be noted that the information from the pixels can be used to generate the output images 13A, 13B, 13C and/or the spectral cube 13.

The image sensor 30 can include a sensor controller 30B, (e.g. a processor) for controlling the operation of the sensor array 30A, including when the sensor array 30A begins and ends collecting light for each image 13A, 13B, 13C. Stated in another fashion, the sensor controller 30B can control the exposure time and frame rate.

Further, the image sensor 30 can include a sensor clock 30C that measures time. The sensor clock 30 is used by the sensor controller 30B to precisely control the operation of the image sensor 30. In certain embodiments, the sensor clock 30 receives source clock information from the light source clock 14J so that the sensor clock 30 can be phase locked to the light source clock 14J.

It should be noted that the sensor controller 30B and the sensor clock 30C can be considered part of the control system 32.

In one embodiment, the light source clock 14J generates a plurality of source signals that are directed to the sensor clock 30C so that the sensor clock 30C is phase locked to the light source clock 14J such that the sensor clock 30C is the slave and the light source clock 14J is the master. Alternatively, the sensor clock 30C can generate a plurality of sensor signals that are directed to the light source clock 14J so that the light source clock 14J is phase locked to the sensor source clock 14J such that the light source clock 14J is the slave and the sensor clock 30C is the master.

Additionally, the control system 32 can include a frame grabber 32C that grabs the information for the individual frames 13A-13C from the image sensor 30 and tags these frames 13A-13C with the appropriate information, such as time stamps corresponding to the edges of the light source clock 14J, and the time stamps corresponding to the completion of motion of the laser grating 14F which sets the center target wavenumber from the light source 14. The latter information enables reliable tagging of valid and invalid frames 13A-13C in the data collection and assigning image frames 13A-13C to corresponding spectral data points during image cube reconstruction.

During use of the spectral imaging device 12, it is desired to improve the spectral resolution and quality of the two-dimensional data for the images 13A-13C of the sample 10 and the spectral cube 13. More specifically, in various applications, it is desired to inhibit various noise sources from adversely impacting the quality of the two-dimensional data of the images 13A, 13B, 13C of the sample 10 that are being generated. Unfortunately, in real systems, various random and systematic noise sources may exist which can cause a diminished and/or undesired SNR. Examples of systematic noise sources include, but are not limited to, the drift in illumination intensity, frequency, and the directional pointing of the source between trials.

In one, non-exclusive embodiment, the control system 32 controls the tunable light source 14 to sequentially generate a plurality of alternative beam sets 240A (illustrated in FIG. 2A) while controlling the image sensor 30 to capture one or more separate output images 13A-13C for each beam set 240A. In this embodiment, each beam set 240A can have a different target center wavenumber (also referred to as "wavenumber of interest"), and the wavenumber of the illumination rays 16A can be modulated through the respective target center wavenumber while the image sensor 30 is capturing the corresponding output images 13A-13C. With this design, when the modulation rate is equal to or greater than the frame rate of the image sensor 30, the finite temporal detection response of the image sensor functions as a low pass filter that suppresses temporal coherence noise of the spectral imaging device 12. Stated in yet another fashion, as provided herein, a reduction in spurious spectral artifacts in the output images 13A-13C can be achieved through fast wavenumber modulation (rapid tuning of the light source 14) and real-time detector averaging (relatively slow capturing of the image with the image sensor 30).

In certain embodiments, the different target center wavenumbers can be particularly useful for identifying one or more characteristics of the sample 10.

Figure 2A:
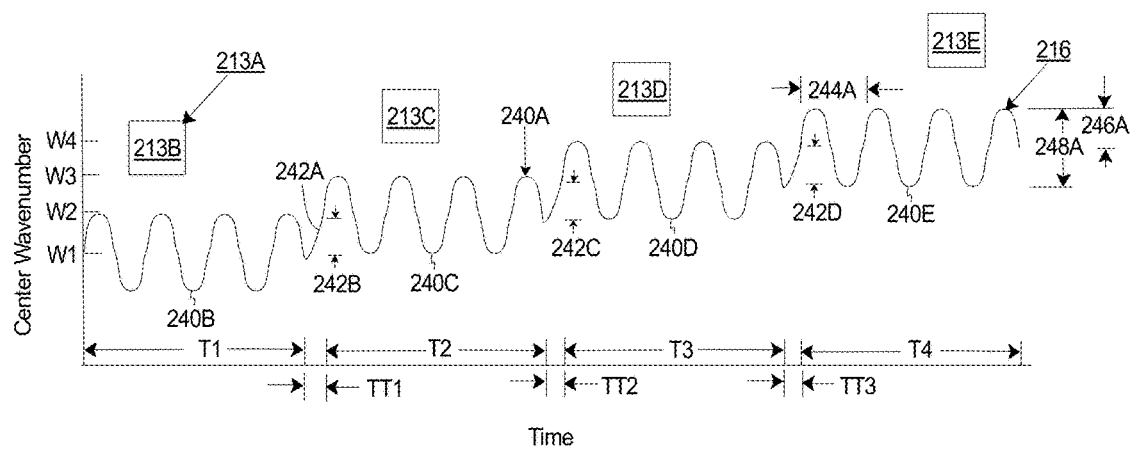
FIG. 2A is a graph that illustrates an illumination beam having a center wavenumber modulates over time.

FIG. 2A is a simplified graph that represents one, non-exclusive example of an illumination beam 216 having a center wavenumber that varies over time. In FIG. 2A, only a relatively small portion of the illumination beam 216 is represented. In this non-exclusive embodiment, the control system 32 (illustrated in FIG. 1A) controls the tunable light source 14 (illustrated in FIG. 1A) so that the illumination beam 216 includes a plurality of sequential beam sets 240A. Further, each beam set 240A can include a different, discrete target center wavenumber in the desired tuning range (e.g. the MIR range). The number of alternative beam sets 240A and/or alternative target center wavenumbers can be varied to suit the desired spectral analysis. In alternative, non-exclusive embodiments, the illumination beam 216 can include 1, 2, 3, 4, 5, 6, 7, 8, 9, 10, 15, 20, 25, 40, 200, 226, 400, 425, 450, 451, 500, 552 or 4000 separate beam sets 240A (and corresponding separate target center wavenumbers).

In FIG. 2A, only four beam sets 240A are illustrated. For convenience, the separate beam sets 240A can be labeled as a first beam set 240B, a second beam set 240C, a third beam set 240D, and a fourth beam set 240E for ease of discussion. In FIG. 2A, the first beam set 240B, the second beam set 240C, the third beam set 240D, and the fourth beam set 240E are generated sequentially in time. Alternatively, the beam sets 240B-240E can be generated in a different order.

In the embodiment illustrated in FIG. 2A, each beam set 240A is generated during a separate time segment, and each beam set 240A has a center wavenumber that modulates over the respective time segment through and around the separate, discrete target center wavenumber. More specifically, as illustrated in FIG. 2A, (i) during a first time segment T1, the first beam set 240B is generated so that the center wavenumber is modulated (dithered) through and about a first target center wavenumber ("W1"); (ii) during a second time segment T2, the second beam set 240C is generated so that the center wavenumber is modulated (dithered) through and about a second target center wavenumber ("W2"); (iii) during a third time segment T3, the third beam set 240D is generated so that the center wavenumber is modulated (dithered) through and about a third target center wavenumber ("W3"); and (iv) during a fourth time segment T4, the fourth beam set 240E is generated so that the center wavenumber is modulated (dithered) through and about a fourth target center wavenumber ("W4").

The duration of each of the beam sets 240A can be varied to achieve the desired spectral analysis. In one non-exclusive embodiment, each of the beam sets 240A has a time segment of at least approximately 1, 5, 10, 20, 30, 60, 90, 120, 150, 180, or 210 milliseconds or at least 0.001, 0.1, 1, 10, 100 times the frame collection time set by the reciprocal of the frame rate. In FIG. 2A, the first time segment T1, the second time segment T2, the third time segment T3, and the fourth time segment T4, each have the same duration. Alternatively, one or more of the time segments T1-T4 can be longer or shorter than the other time segments.

In certain embodiments, each of the target center wavenumbers W1-W4 is different. Thus, a wavenumber step 242A exists between adjacent (in wavenumber) target center wavenumbers W1-W4. Stated in another fashion, as illustrated in FIG. 2A, between successive beams sets 240A, the light source 14 is controlled so that the illumination beam 216 includes the wavenumber step 242A that transitions between adjacent beam sets 240A. More specifically, (i) during a first transition time (TT1), the center wavenumber is stepped from the first beam set 240B to the second beam set 240C; (ii) during a second transition time (TT2), the center wavenumber is stepped from the second beam set 240C to the third beam set 240D; and (iii) during a third transition time (TT3), the center wavenumber is stepped from the third beam set 240D to the fourth beam set 240E.

As provided herein, the wavenumber step 242 between any two, adjacent in wavenumber, target center wavenumbers W1-W4 can be varied. In alternative, non-exclusive embodiments, the wavelength step 242A any two, adjacent in wavenumber, target center wavenumbers W1-W4 can be approximately 0.1, 0.25, 0.5, 1, 1.5, 2, 2.5, 3, 3.1, 3.5, 4, 4.2, 5, 10, 15, 25, 30, 50, 100, 250, 500, 1000 cm$^{-1}$ wavenumbers.

Further, in FIG. 2A, the magnitude of the target center wavenumbers increases from the first target center wavenumber W1 to the fourth target center wavenumber W4. Thus, with each successive beam set 240A, the target center wavenumber W1-W4 is larger in magnitude. Alternatively, for example, the magnitude of the target center wavenumbers W1-W4 can be decreased with any subsequent beam set 240A.

Further, the sequence of wavenumber steps may increase or decrease or follow a cyclical pattern with either a definite or indefinite number of cycles completed. For example W1→W2→W3→W1→W2→W3 and so on or W1→W2→W3→W2→W1 and so on.

Moreover, the shape of each of the beam sets 240A can be varied to achieve the desired spectral analysis. In the embodiment illustrated in FIG. 2A, each of the beam sets 240A has a smooth sinusoidal shape. Alternatively, one or more of the beam sets 240A can have a different shape or profile. For example, one or more of the beam sets 240A can modulate in a linear form. Still, alternatively, for example, one or more of the beam sets 240A can have a variable sinusoidal shape, a somewhat rectangular profile, a somewhat saw tooth or triangular, profile or another quasi-periodic shape.

As provided herein, each beam set 240A has (i) a modulation cycle 244A; (ii) a modulation phase angle; (iii) a modulation amplitude 246A; (iv) a peak-to trough value 248A; and (v) a modulation rate. As provided herein, for each respective beam set 240A, (i) the term "modulation cycle" 244A represents the interval of time between successive occurrences of the same pattern in the beam set; (ii) the term "modulation phase angle" is equal to an integer multiple of two pi times the modulation rate times the relative time between the clock start time and the time when the target wavenumber is being generated; (iii) the term "modulation amplitude" 246A represents the maximum extent of variation from the respective target center wavenumber in the respective beam set 240A; (iv) the term "peak-to trough value" 248A represents the difference between the largest wavenumber and the smallest wavenumber in the respective beam set 240A; and (v) the term "modulation rate" represents the number of modulation cycles 244A that occur (frequency in which the modulation cycle 244A is repeated) for the respective beam set 240A for each second of time.

In FIG. 2A, the modulation cycle 244A, the modulation amplitude 246A, the "peak-to trough value" 248A, and the modulation rate is the same for each of the beam sets 240A. Alternatively, the illumination beam 216 can be generated in which one or more of the modulation cycle 244A, the modulation amplitude 246A, the "peak-to trough value" 248A, and/or the modulation rate can be different for one or more of the beam sets 240A.

In certain embodiments, the illumination beam 216 is generated so that the peak-to-trough value 248A is equal to or greater than fifty percent (50%) of the wavenumber step 242A. As an alternative, non-exclusive examples, the illumination beam 216 is generated so that the peak-to-trough value 248A is equal to or greater than 1, 10, 25, 40, 55, 75, 100, 150, 200, or 300 percent of the wavenumber step 242A.

As alternative, non-exclusive examples, each beam set 240A can have (i) a modulation amplitude 246A of approximately 0.1, 0.25, 0.5, 1, 2, 2.1, 3, 3.2, 3.3, 4, 6, 8, 10 or 20 cm$^{-1}$ wavenumbers; (ii) a "peak-to trough value" 248A of approximately 0.5, 1, 2, 2.1, 3, 3.2, 3.3, 4, 6, 8, 10, 20, or 40 cm$^{-1}$ wavenumbers; and (iii) a modulation rate of approximately 30, 60, 80, 120, 150, 200, 240, or 480 hertz.

It should be noted that during the generation of each beam set 240A, the control system 32 controls the image sensor 30 (illustrated in FIG. 1A) to capture one or more images 213A (illustrated as a boxes) that corresponds to the respective target center wavenumber. More specifically, (i) during the first time segment T1, the image sensor 30 captures one or more first output images 213B (only one is illustrated) that correspond to the first target wavenumber W1; (ii) during the second time segment T2, the image sensor 30 captures one or more second output images 213C (only one is illustrated) that correspond to the second target wavenumber W2; (iii) during the third time segment T3, the image sensor 30 captures one or more third output images 213D (only one is illustrated) that correspond to the third target wavenumber W3; and (iv) during the fourth time segment T4, the image sensor 30 captures one or more fourth output images 213E (only one is illustrated) that correspond to the fourth target wavenumber W4.

It should be noted that the images (frames) may be captured at any time during a time segment.

It should also be noted that control system 32 can control the image sensor 30 to have a frame rate during the capturing of the images 213A-213E. As provided herein, the term "frame rate" of the image sensor 30 is the number of frames that are captured per second by the image sensor 30. As an alternative, non-exclusive examples, the image sensor 30 can be controlled to have a frame rate of approximately 15, 30, 60, 80, 120, 150, 200, 240, 500, 1000, 1500, and 2000 hertz.

As provided herein, in certain embodiments, the control system 32 controls the tunable light source 14 so that the beam sets 240A-240E have a modulation rate that is equal to or greater than the frame rate of the image sensor 30. In certain embodiments, the control system 32 controls the tunable light source 14 so that the beam sets 240A-240E have a modulation rate that is approximately equal to an integer multiple of the frame rate. In alternative, non-exclusive embodiments, the beam sets 240A-240E have a modulation rate that is approximately equal to 1, 2, 3, 4, 5, 6, 7, 8, 9, 10, 20, 40, 50 or 100 or more times the frame rate. Stated in another fashion, in alternative, non-exclusive embodiments, the beam sets 240A-240E have a modulation rate that is at least approximately 1, 2, 3, 4, 5, 6, 7, 8, 9, 10, 20, 40, 50 or 100 times the frame rate.

As used in the previous paragraph, the term "approximately equal" shall mean being within ten percent (10%) of the stated multiplier.

With the present design, the modulation of the parasitic etalons in the spectral imaging device 12 are filtered by fast wavenumber modulation of the light source 14 (higher than the frame rate of the image sensor 30) for real-time image sensor 30 averaging (low pass filter effect). This has an effect of averaging out the temporal coherence noise artefacts associated with parasitic etalons of the spectroscopic imaging system and improving the resulting image quality and spectral fidelity. In many instances, the features of interest are broader than a narrow line width. Additionally, the parasitic etalons can be finer than the features of interest. Thus, it can be advantageous to average the unwanted spectral noise that manifests itself as a fringe pattern in the spatial domain by using a broad optical frequency (e.g. modulate optical frequency over time).

It should be noted that in the embodiments in which the modulation rate is an integer multiple of the frame rate, the parasitic etalons are better averaged out and the resulting image quality is improved.

Figure 2B:
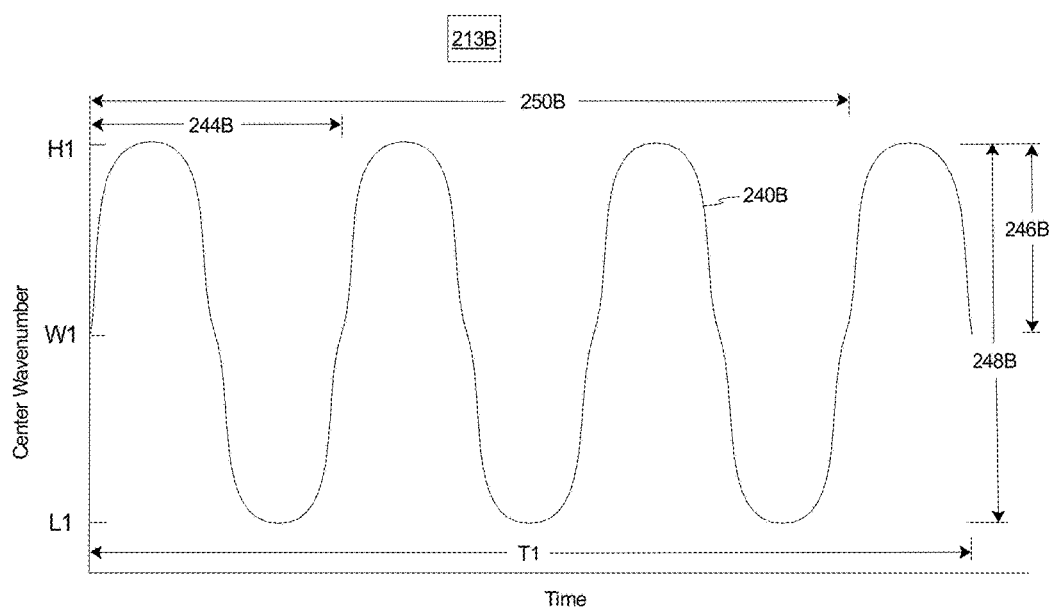
FIG. 2B is a graph that illustrates a portion of the illumination beam of FIG. 2A.

FIG. 2B is a simplified graph that represents how a center wavenumber varies versus time for the first beam set 240B directed at the sample 10 (illustrated in FIG. 1A). In this example, during the first time segment T1, the control system 32 (illustrated in FIG. 1A) controls the tunable light source 14 (illustrated in FIG. 1A) so that the center wavenumber of the illumination rays of the first beam set 240B are modulated (varied or dithered) over time through the first target wavenumber ("W1") during generation of the first beam set 240B. In this embodiment, the first beam set 240B has a first modulation cycle 244B, a first modulation amplitude 246B, a first peak-to-trough value 248B, a first, low, center wavenumber ("L1"), a first, high, center wavenumber ("H1"); and a first modulation rate.

Further, during generation of the first beam set 240B, the control system 32 controls the image sensor 30 (illustrated in FIG. 1A) to capture one or more first output images 213B (only one is illustrated as a box) that corresponds to the first target center wavenumber W1. In FIG. 2B, the first output image 213B is captured during a first capture time 250B (illustrated with an arrow) with the image sensor 30.

In this embodiment, the first capture time 250B is three times longer than the first modulation cycle 244B. Thus, the first frame rate is three times less than the first modulation rate. Stated in another fashion, in this example, there are three, first modulation cycles 244B during the first capture time 250B. As alternative, non-exclusive examples, the number of modulation cycles 244B during each capture time 250B can be 1, 2, 4, 5, 10, 20, 40, 50 or 100 or more.

It should be noted that in the simplified example illustrated in FIG. 2B, the first capture time 250B begins at the same time in which the center wavenumber is at the first target center wavenumber W1. Thus, the image sensor 30 is in phase with the first beam set 240B, and the image sensor 30 is synchronized with the first beam set 240B. As a result of the, phase synchronization between the camera frame capture and the modulation coherence artifacts are optimally reduced.

Alternatively, for example, the first capture time 250B can begin during the first beam set 240B when the center wavenumber is not at the first target center wavenumber W1. In this example, the image sensor 30 still retains a fixed but shifted phase relationship with the first beam set 240B, and the image sensor 30 remains synchronous. This relative phase can be adjusted by the control system to optimize the noise performance.

It should be noted that as the number modulation cycles 244B during the capture time 250B of each first output images 213B is increased, the less influence phase error will have on the image quality. This is because the coherence noise amplitude is reduced with increasing modulation rate and at some point will be lower than the camera detection limit. This is the most desirable and optimal condition. However, in practice it is not always possible to modulate at sufficiently high rates. Therefore, phase synchronization assures best performance.

Figure 2C:
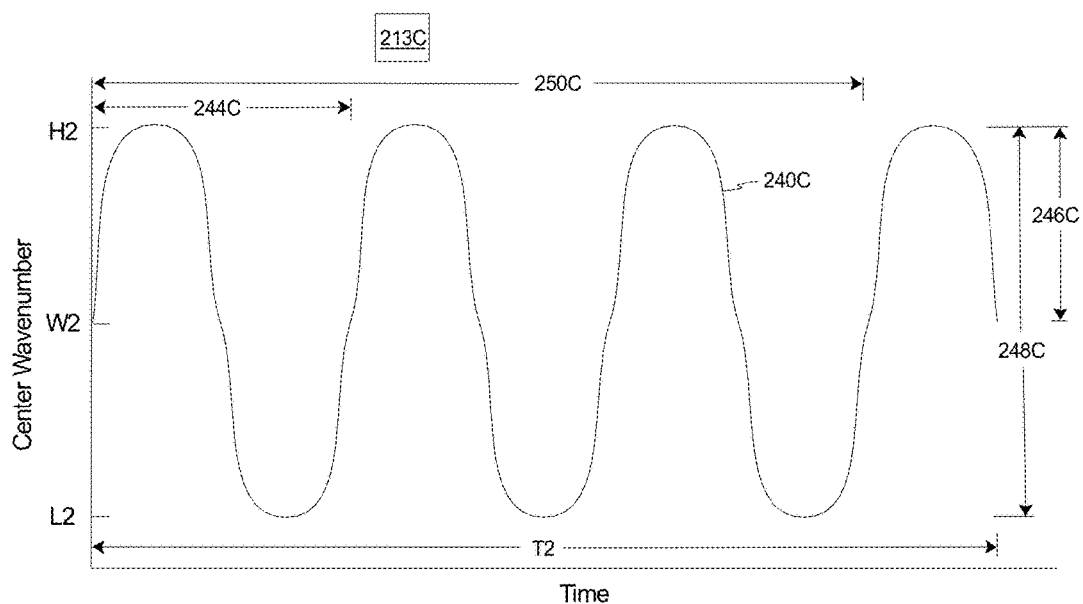
FIG. 2C is a graph that illustrates another portion of the illumination beam of FIG. 2A.

FIG. 2C is a simplified graph that represents how a center wavenumber varies versus time for the second beam set 240C. In this example, the control system 32 (illustrated in FIG. 1A) controls the tunable light source 14 (illustrated in FIG. 1A) so that the center wavenumber of the illumination rays of the second beam set 240C are modulated (varied or dithered) over time through the second target wavenumber ("W2") during generation of the second beam set 240C during the second time segment T2. In this embodiment, the second beam set 240C has a second modulation cycle 244C, a second modulation amplitude 246C, a second modulation phase, a second peak-to-trough value 248C, a second, low, center wavenumber ("L2"), a second, high, center wavenumber ("H2"); and a second modulation rate.

Further, during generation of the second beam set 240C, the control system 32 controls the image sensor 30 (illustrated in FIG. 1A) to capture the second output image 213C (illustrated as a box) that corresponds to the second target center wavenumber W2 during a second capture time 250C (illustrated with an arrow). In this embodiment, the second capture time 250C is again three times longer than the second modulation cycle 244C. Further, in this embodiment, the second output image 213C is in phase with the second beam set 240C.

Figure 2D:
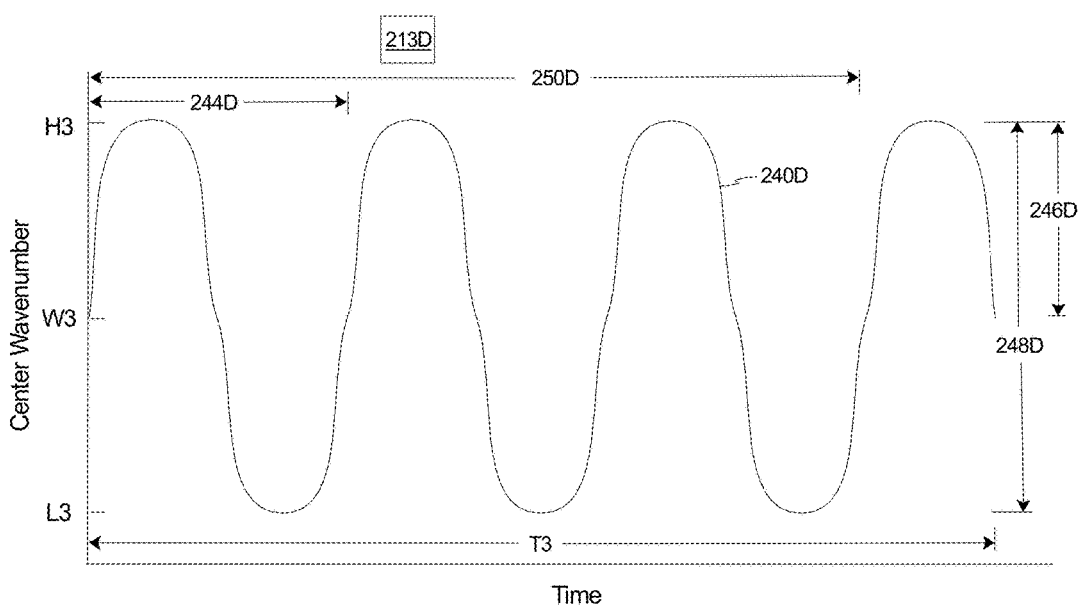
FIG. 2D is a graph that illustrates yet another portion of the illumination beam of FIG. 2A.

FIG. 2D is a simplified graph that represents how a center wavenumber varies versus time for the third beam set 240D. In this example, the center wavenumber of the third beam set 240D is modulated (varied or dithered) over time through the third target wavenumber ("W3") during the third time segment T3. In this embodiment, the third beam set 240D has a third modulation cycle 244D, a third modulation amplitude 246D, a third peak-to-trough value 248D, a third, low, center wavenumber ("L3"), a third, high, center wavenumber ("H3"); and a third modulation rate.

Further, during generation of the third beam set 240D, the control system 32 controls the image sensor 30 (illustrated in FIG. 1A) to capture the third output image 213D (illustrated as a box) that corresponds to the third target center wavenumber W3 during a third capture time 250D (illustrated with an arrow). In this embodiment, the third capture time 250D is three times longer than the third modulation cycle 244D. Further, in this embodiment, the third output image 213D is in phase with the third beam set 240D.

Figure 3:
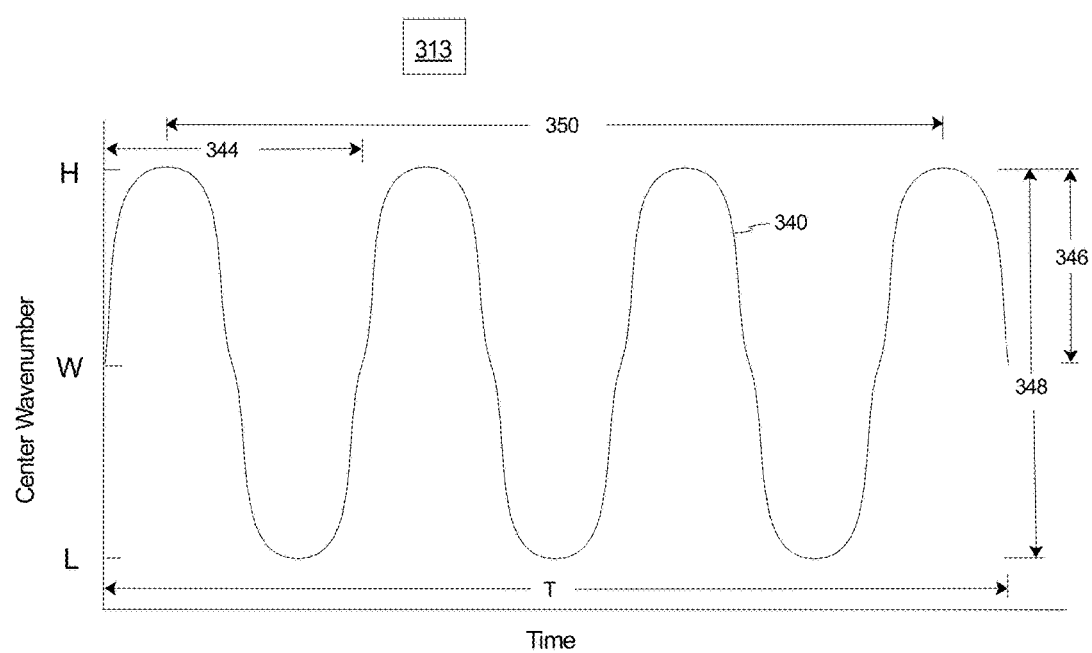
FIG. 3 is a graph that illustrates another illumination beam having a center wavenumber modulates over time.

FIG. 3 is a simplified graph that represents how a center wavenumber varies versus time for another beam set 340 generated during time segment T. In this example, the center wavenumber of the beam set 340 is modulated (varied or dithered) over time through the target wavenumber ("W"). In this embodiment, the beam set 340 has a modulation cycle 344, a modulation amplitude 346, a peak-to-trough value 348, a low, center wavenumber ("L"), a high, center wavenumber ("H"); and a modulation rate.

Further, during generation of the beam set 340, the control system 32 controls the image sensor 30 (illustrated in FIG. 1A) to capture the output image 313 (illustrated as a box) that corresponds to the target center wavenumber W during a capture time 350 (illustrated with an arrow). In this embodiment, the capture time 350 begins during the beam set 340 when the center wavenumber is not at the target center wavenumber W. In this example, the image sensor 30 is out of phase with the beam set 340.

Figure 4:
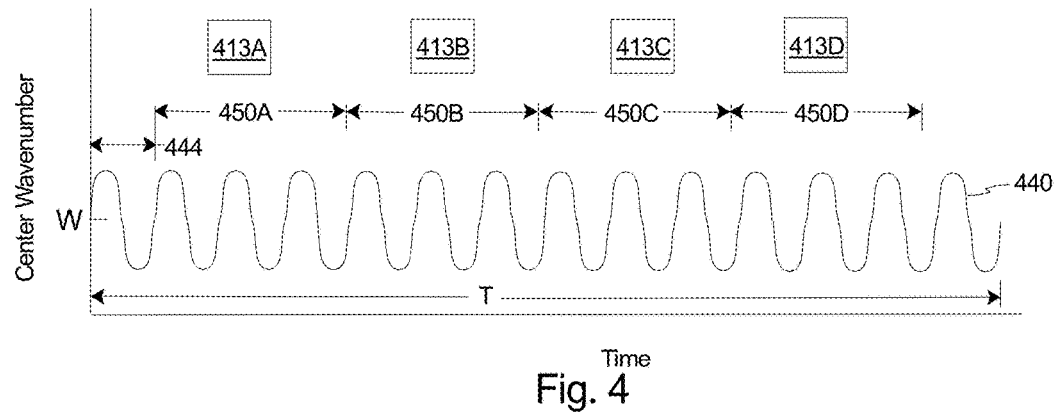
FIG. 4 is a graph that illustrates yet another illumination beam having a center wavenumber modulates over time.

FIG. 4 is a simplified graph that represents how a center wavenumber varies versus time for yet another beam set 440 generated during time segment T. In this example, the center wavenumber of the beam set 440 is modulated (varied or dithered) over time through the target wavenumber ("W") while directed at the sample 10. Further, during generation of the beam set 440, the control system 32 controls the image sensor 30 (illustrated in FIG. 1A) to capture four, sample images 413A, 413B, 413C, 413D (illustrated as a boxes) that correspond to the target center wavenumber W, each during a sequential capture time 450A, 450B, 450C, 450D. In this embodiment, each capture time 450A-450D begins during the beam set 440 when the center wavenumber is at the target center wavenumber W. In this example, the image sensor 30 is in-phase with the beam set 440. In certain embodiments, the wavelength of the illumination beam generated by the light source 14 is more accurate during middle to the end of each beam set 440. Thus, in certain embodiments, sample images 413C, 413D may be more accurate than sample images 413A, 413B because the light source had more time to stabilize. It should be noted that it may be advantageous to add a controlled delay between the time that the center wavelength of the beam has reached the target center wavelength and the time corresponding to the start of the image frame associated with the spectral image measurement. This is to ensure that the image transients emanating from the fixed integration time constant of the camera will pass before valid data is acquired.

Figure 5:
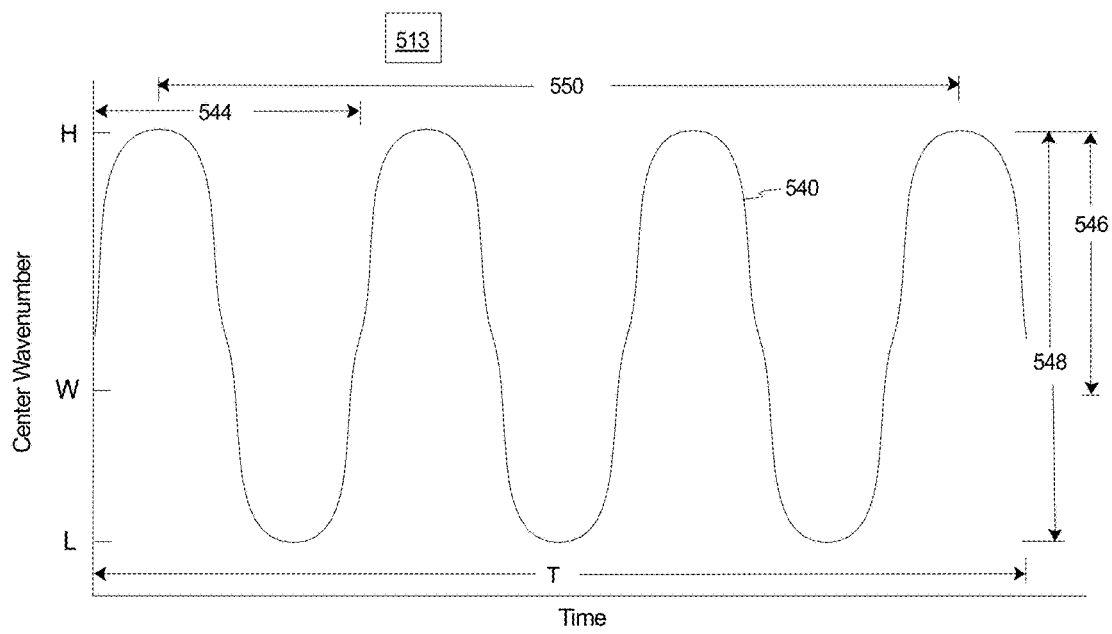
FIG. 5 is a graph that illustrates still another illumination beam having a center wavenumber modulates over time.

FIG. 5 is a simplified graph that represents how a center wavenumber varies versus time for still another beam set 540 generated during time segment T. In this example, the center wavenumber of the beam set 540 is modulated (varied or dithered) over time through the target wavenumber ("W"). In this embodiment, the beam set 540 has a modulation cycle 544, a modulation amplitude 546, a peak-to-trough value 548, a low, center wavenumber ("L"), a high, center wavenumber ("H"); and a modulation rate. It should be noted that in this embodiment, the target center wavenumber W is not in at the center of the peak-to-trough value 548. Thus, the modulation amplitude 546 is larger for this example.

Further, during generation of the beam set 540, the control system 32 controls the image sensor 30 (illustrated in FIG. 1A) to capture the output image 513 (illustrated as a box) that corresponds to the target center wavenumber W during a capture time 550 (illustrated with an arrow). In this embodiment, the capture time 550 begins during the beam set 540 when the center wavenumber is not at the target center wavenumber W. In this example, the image sensor 30 is out of phase with the beam set 540, and the image sensor 30 is asynchronous.

Figure 6:
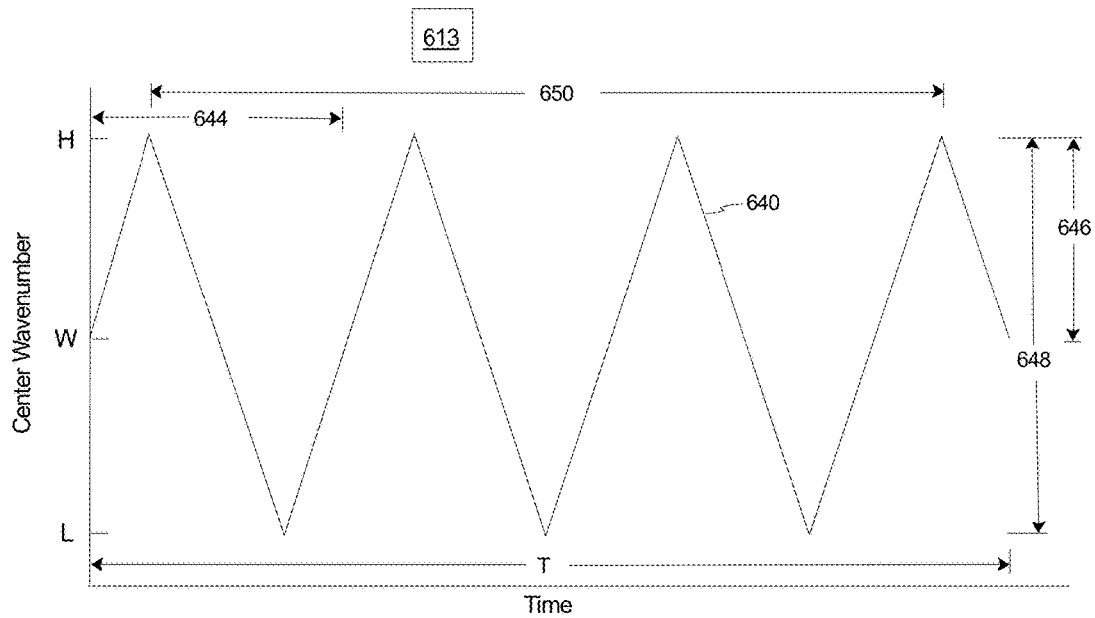
FIG. 6 is a graph that illustrates another illumination beam having a center wavenumber modulates over time.

FIG. 6 is a simplified graph that represents how a center wavenumber varies versus time for still another beam set 640 generated during time segment T. In this example, the center wavenumber of the beam set 640 is modulated (varied or dithered) over time through the target wavenumber ("W"). In this embodiment, the beam set 640 has a modulation cycle 644, a modulation amplitude 646, a peak-to-trough value 648, a low, center wavenumber ("L"), a high, center wavenumber ("H"); and a modulation rate. In this embodiment, wavenumber of the beam set 640 modulates in a linear fashion.

Further, during generation of the beam set 640, the control system 32 controls the image sensor 30 (illustrated in FIG. 1A) to capture the output image 613 (illustrated as a box) that corresponds to the target center wavenumber W during a capture time 650 (illustrated with an arrow). In this embodiment, the capture time 650 begins during the beam set 640 when the center wavenumber is not at the target center wavenumber W.

Figure 7:
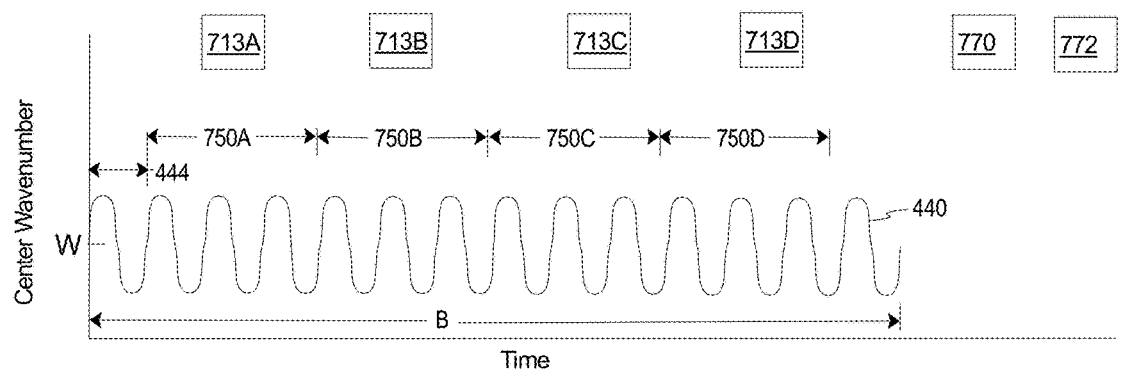
FIG. 7 is a graph that illustrates still another illumination beam having a center wavenumber modulates over time and a plurality of background images.

As provided above, the quality of the final output images can be improved by comparing the pixel-by-pixel information of the sample images captured when the illumination beam is directed at the sample 10 to corresponding (i) illuminated background images generated without the sample 10, (ii) dark background images generated with the sample 10 in place and without illumination, and/or (iii) dark background images generated without the sample 10 in place and without illumination. FIG. 7 is a graph that illustrates the same beam set 440 that is illustrated in FIG. 4. However, this beam set 440 was generated during time segment B, when a plurality of illuminated (no sample) background images 713A, 713B, 713C, 713D were captured without the sample 10.

In this example, the center wavenumber of the beam set 440 is modulated over time through the target wavenumber ("W") without the sample 10 being present. Although, a substrate on which the sample is fixed may remain in the beam path so as to be included in the background measurement. Further, during generation of the beam set 440, the control system 32 controls the image sensor 30 (illustrated in FIG. 1A) to capture four illuminated (no sample) background images 713A, 713B, 713C, 713D (illustrated as a boxes) that correspond to the target center wavenumber W, each during a sequential capture time 750A, 750B, 750C, 750D.

In certain embodiments, the illuminated (no sample) background images 713A, 713B, 713C, 713D and the corresponding sample images 413A, 413B, 413C, 413D are captured under similar conditions, e.g. the same (i) modulation cycle; (ii) modulation phase angle; (iii) modulation amplitude; (iv) peak-to trough value; and (v) modulation rate.

Additionally, it should be noted that one or more dark (no illumination, no sample) background images 770 (only one is illustrated in FIG. 7) can be captured by the image sensor 30. These dark (no illumination, no sample) background images 770 can be captured at random times by the image sensor 30 without illumination by the light source 14 (illustrated in FIG. 1A) and without the sample 10 in place. The substrate that retains the sample 10 can be in place during the capturing of the dark (no sample) background images 770. It should be noted that if a plurality of dark (no sample) background images 770 are captured, they can be averaged or processed in another fashion.

Moreover, one or more dark (no illumination, with sample) background images 772 (only one is illustrated in FIG. 7) can be captured by the image sensor 30. These dark (with sample) background images 772 can be captured at random times by the image sensor 30 without illumination by the light source 14 (illustrated in FIG. 1A) and with the sample 10 in place. It should be noted that if a plurality of dark (with sample) background images 770 are captured, they can be averaged or processed in another fashion.

Figure 8:
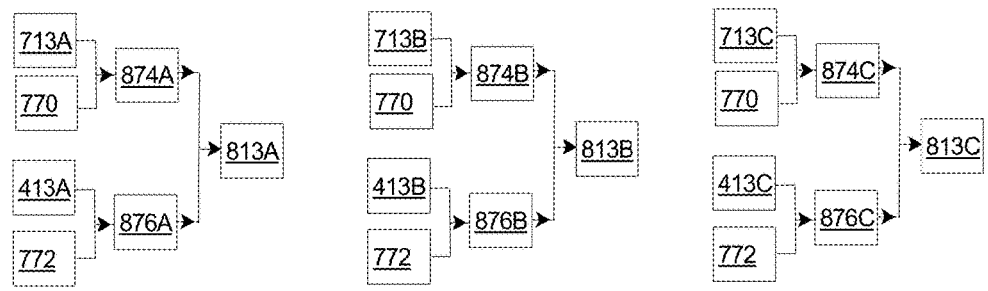
FIG. 8 is a simplified illustration of a plurality of final output images.

FIG. 8 is a simplified illustration of how the final output images can be generated. In one non-exclusive example, (i) on a pixel-by-pixel basis, the dark (no illumination, no sample) background image 770 can be subtracted from the illuminated (no sample) background image 713A to create a no sample image 874A; and (ii) on a pixel-by-pixel basis, the dark (no illumination, with sample) background image 772 can be subtracted from the sample image 413A to create an adjusted sample image 876A. Subsequently, the no sample image 874A and the adjusted sample image 876A can be ratioed to create the final output image 813A.

Similarly, (i) on a pixel-by-pixel basis, the dark (no sample) background image 770 can be subtracted from the illuminated (no sample) background image 713B to create a no sample image 874B; and (ii) on a pixel-by-pixel basis, the dark (with sample) background image 772 can be subtracted from the sample image 413B to create an adjusted sample image 876B. Subsequently, the no sample image 874B and the adjusted sample image 876B can be ratioed to create the final output image 813B.

Further, (i) on a pixel-by-pixel basis, the dark (no sample) background image 770 can be subtracted from the illuminated (no sample) background image 713C to create a no sample image 874C; and (ii) on a pixel-by-pixel basis, the dark (with sample) background image 772 can be subtracted from the sample image 413C to create an adjusted sample image 876C. Subsequently, the no sample image 874C and the adjusted sample image 876C can be ratioed to create the final output image 813C.

It should be noted that the other final output images can be calculated in a similar fashion or in a different fashion than described above.

It should also be noted that when the sample images 413A, 413B, 413C, 413D are compared to reference images 713A, 713B, 713C, 713D that are captured under similar illumination conditions (including the correct phase), the resulting final output images 813A, 813B, 813C have less noise and are therefore more accurate.

Figure 9:
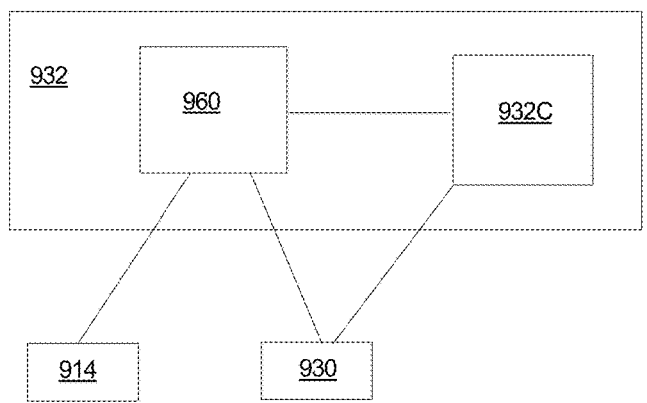
FIG. 9 is a simplified illustration of a control system having features of the present invention.

With reference to FIG. 9, in certain embodiments, the control system 932 can include a master clock 960 that is used (i) to control the timing of when the light source 914 (illustrated as a box) is generating the illumination beam, and (ii) to control the timing of when the image sensor 930 (illustrated as a box) captures the images. Because the master clock 960 is used to control both the light source 914 and the image sensor 930, the image sensor 930 can be phase locked with the light source 914, the image sensor 930 is synchronized with the light source 914, and the present invention is more immune to phase errors and long term drift. Phase error can lead to degradation of the quality of the spectroscopic images.

Additionally, the control system 932 can include a frame grabber 932C that receives the information of the images from the image sensor 930 to generate the images. Additionally, the frame grabber 932C can receive one or more clock signals from master clock 960 that can be associated with the respective images. For example, the frame grabber 932C can receive the clock signals to associate the appropriate time with the images. Further, the frame grabber 932C can receive the wavenumber information from the light source 914, can receive signals from the light source 914 when the target wavenumbers are reached, and can receive other time events from the master clock 960. With this design, the frame grabber 932C acts as the master system time keeper to accurately tag each image with the appropriate wavenumber state of the laser source.

For example, the master control board generating the master clock can also send a separate signal when each target center wavenumber is generated, and can also generate a signal when moving from one beam set to the other beam set.

Figure 10:
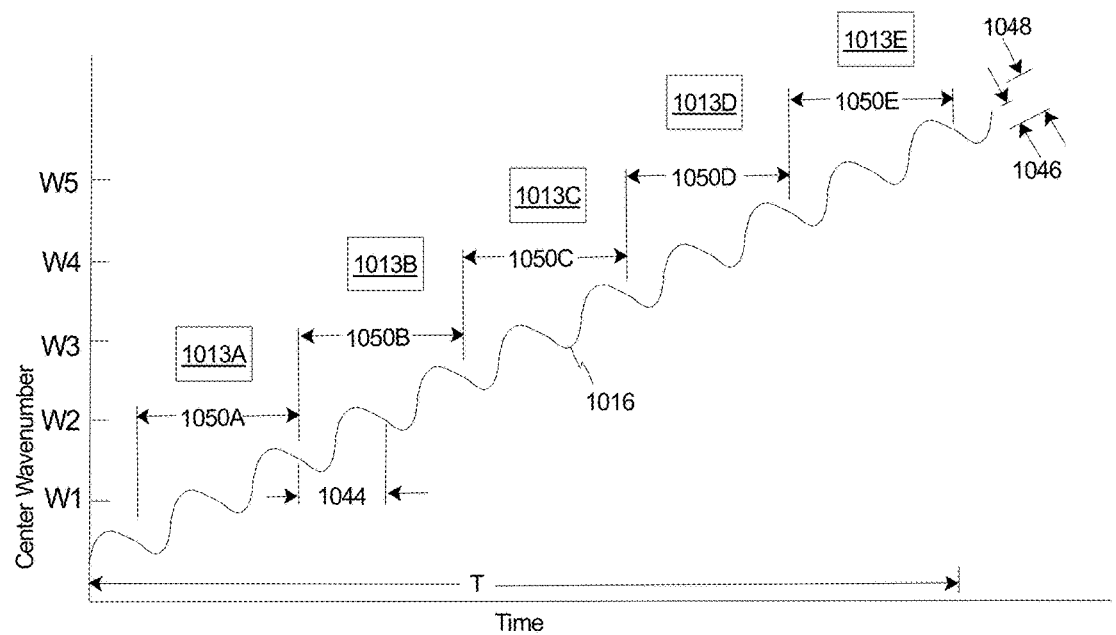
FIG. 10 is a graph that illustrates another embodiment of an illumination beam having a center wavenumber modulates over time.

FIG. 10 is a simplified graph that represents another, non-exclusive example of an illumination beam 1016 having a center wavenumber that varies over time during a time segment T. In FIG. 10, only a relatively small portion of the illumination beam 1016 is represented. In this non-exclusive embodiment, the control system 32 (illustrated in FIG. 1A) controls the tunable light source 14 (illustrated in FIG. 1A) so that the illumination beam 1016 modulates while continuously changing the target center wavenumber. In FIG. 10, the portion of the illumination beam 1016 illustrated includes five separate target center wavenumbers, namely W1, W2, W3, W4, W5. In alternative, non-exclusive embodiments, the illumination beam 1016 can be generated to include 1, 2, 3, 4, 5, 10, 15, 20, 25, 40, 200, 226, 400, 430, 451, 552 or 4000 separate target center wavenumbers.

It should be noted that during the generation of the illumination beam 1016, the control system 32 controls the image sensor 30 (illustrated in FIG. 1A) to continuously and sequentially form images that correspond to the respective target center wavenumbers W1, W2, W3, W4, W5. More specifically, (i) during a first capture time 1050A, the image sensor 30 captures one or more first sample images 1013A that correspond to the first target wavenumber W1; (ii) during a second capture time 1050B, the image sensor 30 captures one or more second sample images 10138 that correspond to the second target wavenumber W2; (iii) during a third capture time 1050C, the image sensor 30 captures one or more third sample images 1013C that correspond to the third target wavenumber W3; (iv) during a fourth capture time 1050D, the image sensor 30 captures one or more fourth sample images 1013D that correspond to the fourth target wavenumber W2; and (v) during a fifth capture time 1050E, the image sensor 30 captures one or more fifth sample images 1013E that correspond to the fifth target wavenumber W5.

It should be noted that (i) during the first capture time 1050A, the center wavenumber is modulated (dithered) through and about the first target center wavenumber W1; (ii) during the second capture time 1050B, the center wavenumber is modulated (dithered) through and about the second target center wavenumber W2; (iii) during the third capture time 1050C, the center wavenumber is modulated (dithered) through and about the third target center wavenumber W3; (iv) during the fourth capture time 1050D, the center wavenumber is modulated (dithered) through and about the fourth target center wavenumber W4; and (i) during the fifth capture time 1050E, the center wavenumber is modulated (dithered) through and about the fifth target center wavenumber W5.

Further, in FIG. 10, the magnitude of the target center wavenumbers increases linearly from the first target center wavenumber W1 to the fifth target center wavenumber W5. Thus, with each successive target center wavenumber W1-W5 is larger in magnitude. In alternative, non-exclusive embodiments, the illumination beam 1016 can be generated so that the target center wavenumbers are changed linearly at a slope of approximately 1, 3, 5, 10, 15, 17, 20, 25, 50, 100, 120, 120.1, and 240 cm−1/sec.

Alternatively, for example, the magnitude of the target center wavenumbers W1-W5 can be decreasing linearly during the capturing of the images 1013A, 1013B, 1013C, 1013D, 1013E. Still alternatively, the magnitude of the target center wavenumbers W1-W5 can be increased or decreased in a non-linear fashion and/or an arbitrary fashion during the capturing of the images 1013A, 1013B, 1013C, 1013D, 1013E.

Moreover, the temporal wavenumber evolution of the illumination beam 1016 can be varied to achieve the desired spectral noise performance while also minimizing spectral line distortion that may impact quantitative analysis. In the embodiment illustrated in FIG. 10, the illumination beam temporal wavenumber evolution 1016 has a smooth sinusoidal shape. Alternatively, the illumination beam temporal wavenumber evolution 1016 can have a different shape or profile.

In certain embodiments, if the modulation rate is greater than ten (10) times that of the camera frame rate, then aperiodic modulation of the wavenumber about the center target wavenumber may be acceptable since the amplitude of the modulated noise signals will be sufficiently small compared to the camera noise floor such that the phase of the noise has negligible contribution to the noise performance of the system. In such case, for example, modulation having a broadband spectral characteristic such as that approximating a white noise distribution may be desirable or even optimal.

It should be noted that the illumination beam 1016 includes (i) a modulation cycle 1044; (ii) a modulation amplitude 1046; and (iii) a peak-to trough value 1048. As alternative, non-exclusive examples, the illumination beam 1016 can have (i) a modulation amplitude 1046 of approximately 1, 2, 4, 6, 8, 10 or 20 cm$^{-1}$ wavenumbers; (ii) a "peak-to trough value" 1048 of approximately 2, 4, 6, 8, 10, 20, or 40 cm$^{-1}$ wavenumbers; and (iii) a modulation rate of approximately 30, 60, 80, 120, 150, 200, 240, 480, 500, 750, 1000, 1500, or 2000 hertz.

In certain embodiments, the control system 32 controls the tunable light source 14 so that the illumination beam 1016 has a modulation rate that is equal to or greater than the frame rate. In certain embodiments, the control system 32 controls the tunable light source 14 so that the illumination beam 1016 has a modulation rate that is approximately equal to an integer multiple of the frame rate. In alternative, non-exclusive embodiments, the illumination beam 1016 have a modulation rate that is approximately equal to 1, 2, 4, 5, 10, 20, 40, 50 or 100 or more times the frame rate. Stated in another fashion, in alternative, non-exclusive embodiments, the light source 14 (illustrated in FIG. 1A) and the image sensor 30 (illustrated in FIG. 1A) are controlled so that the illumination beam 1016 has a modulation rate that is at least approximately 1, 2, 3, 4, 5, 6, 7, 8, 9, 10, 20, 40, 50 or 100 times the frame rate.

With the present design, the spectral noise arising from the substantially coherent light of the interrogation beam with the parasitic etalons in the spectral imaging device 12 are filtered, that is reduced, by the fast wavenumber modulation of the light source 14 (higher than the frame rate of the image sensor 30) due to the real-time image sensor 30 averaging (low pass filter effect).

Figure 11:
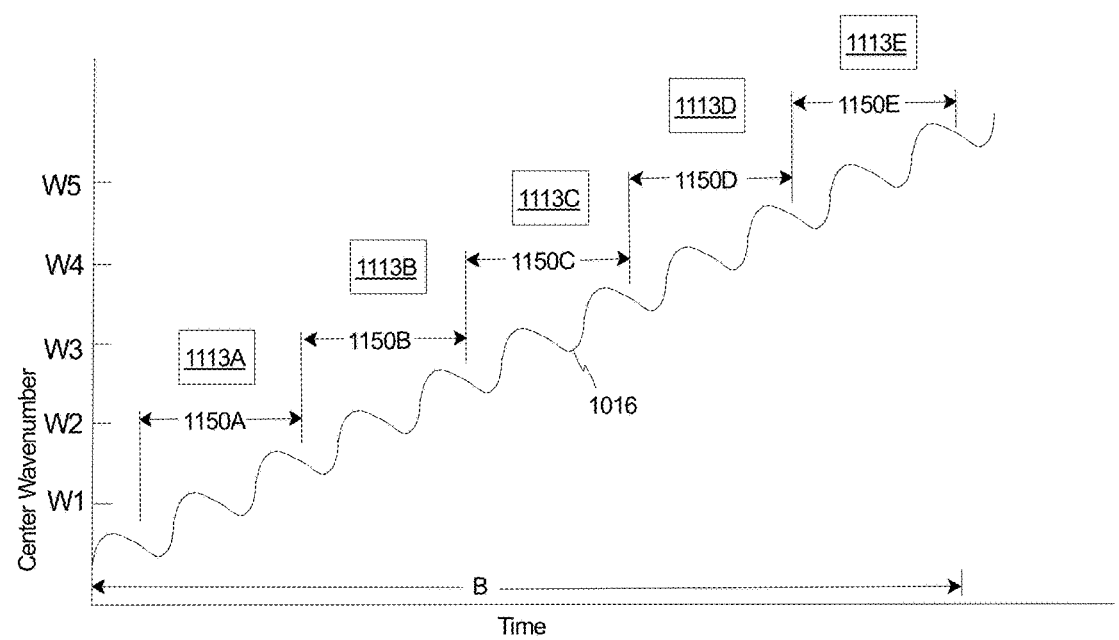
FIG. 11 is a graph that illustrates the illumination beam of FIG. 10 at a different time.

As provided above, the quality of the final output images can be improved by comparing the pixel-by-pixel information of the sample images captured when the illumination beam is directed at the sample 10 to corresponding illuminated, background images generated without the sample 10. FIG. 11 is a graph that illustrates the same illumination beam 1016 that is illustrated in FIG. 10. However, this illumination beam 1016 was generated during time segment B, when a plurality of illuminated, no sample background images 1113A, 1113B, 1113C, 1113D, 1113E were captured without the sample 10, during consecutive capture times 1150A, 1150B, 1150C, 1150D, 1150E.

With this design, the final output images (not shown) can be generated by (i) subtracting on a pixel-by-pixel basis the dark (no sample) background image 770 (illustrated in FIG. 8) from the respective, illuminated (no sample) background images 1113A-1113E to create the respective sample images 874B (illustrated in FIG. 8) for each target wavenumber W1-W5; and (ii) subtracting on a pixel-by-pixel basis, the dark (with sample) background image 772 (illustrated in FIG. 8) from the respective sample images 1013A-1013E to create the respective adjusted sample images 876B (illustrated in FIG. 8) for each target wavenumber W1-W5. Subsequently, for each target wavenumber W1-W5, the no sample image 874B and the adjusted sample image 876B can be ratioed to create the final output image 813B (illustrated in FIG. 8).

In an alternative embodiment, (i) the final output image for target wavenumber W1 can be generated by a pixel-by-pixel comparison (e.g. ratio) of images 1013A and 1113A; (ii) the final output image for target wavenumber W2 can be generated by a pixel-by-pixel comparison (e.g. ratio) of images 1013B and 1113B; (iii) the final output image for target wavenumber W3 can be generated by a pixel-by-pixel comparison (e.g. ratio) of images 1013C and 1013C; (iv) the final output image for target wavenumber W4 can be generated by a pixel-by-pixel comparison (e.g. ratio) of images 1013D and 1113D; and (v) the final output image for target wavenumber W5 can be generated by a pixel-by-pixel comparison (e.g. ratio) of images 1013E and 1113E. Because the sample images 1013A, 1013B, 1013C, 1013D, 1013E are compared to reference images 1113A, 1113B, 1113C, 1113D, 1113E that are captured under similar illumination conditions (including the correct phase), the resulting final output images have substantially reduced coherence noise and therefore better image and spectral quality.

Figure 12:
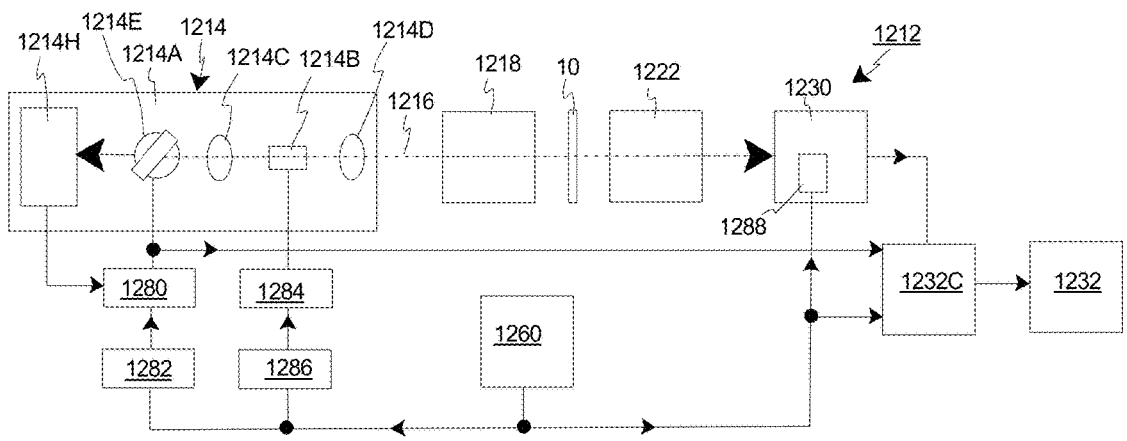
FIG. 12 is a simplified illustration of another embodiment of the spectral imaging microscope.

FIG. 12 is a simplified illustration another embodiment of the spectral imaging device 1212 in transmission mode that including (i) the light source 1214 with the laser frame 1214A, the gain medium 1214B, the cavity optical assembly 1214C, the output optical assembly 1214D, the WS feedback assembly 1214E, and the measurement system 1214H that direct the illumination beam 1216 at the sample 10; (ii) the illumination optical assembly 1218; (iii) the objective optical assembly 1222; (iv) the image sensor 1230; and (v) the control system 1232 that are somewhat similar to the corresponding components described above and illustrated in FIG. 1A.

In this embodiment, the control system 1232 includes a master clock 1260 that is used (i) to control the timing of when the light source 1214 is generating the illumination beam 1216, (ii) to control the WS feedback assembly 1214E to control the center wavenumber of the illumination beam 1216; and (iii) to control the timing of when the image sensor 1230 captures the images. Because the master clock 1260 is used to control both the light source 1214 and the image sensor 1230, the image sensor 1230 can be phase locked with the light source 1214, the image sensor 1230 can be synchronized with the light source 1214, and the present invention is more immune to phase errors and long term drift. Phase error can lead to degradation of the quality of the spectroscopic images.

Additionally, the control system 1232 can include a frame grabber 1232C that receives the information of the images from the image sensor 1230 to generate the images. Additionally, the frame grabber 1232C can receive one or more clock signals from master clock 1260 that can be associated with the respective images. For example, the frame grabber 1232C can receive the clock signals to associate the appropriate time with the images. Further, the frame grabber 1232C can receive the wavenumber information from the light source 1214, can receive signals from the light source 1214 when the target wavenumbers are reached, and can receive other time events from the master clock 1260. With this design, the frame grabber 1232C acts as the master system time keeper to accurately tag each image with the appropriate wavenumber state of the laser source.

For example, the master control board generating the master clock 1260 can also send a separate signal when each target wavenumber is generated by the light source 1214, and can also generate a signal when moving from one beam set to the other beam set.

Further, the control system 1232 can include (i) a WS controller 1280 that controls the WS feedback assembly 1214E, (ii) a synchronous WS unit 1282; (iii) a gain medium controller 1284; and (iv) a synchronous medium unit 1286. In one embodiment, the synchronous WS unit 1282 can be used as a clock multiplier to multiply the modulation rate of the illumination beam 1216, and to control the phase and amplitude of the illumination beam 1216. Somewhat similarly, the synchronous medium unit 1286 can be used as a clock multiplier to multiply the pulsing of the gain medium and timing of the pulsing.

Additionally, the control system 1232 can include a phase lock loop unit 1288 that locks the capturing of the images to the generation of the illumination beam 1216.

Still alternatively, the control system can receive a notification about when the wavenumber is being been modulated about a target wavenumber, and the control system can trigger the capturing of the image upon the notification.

Figure 13A:
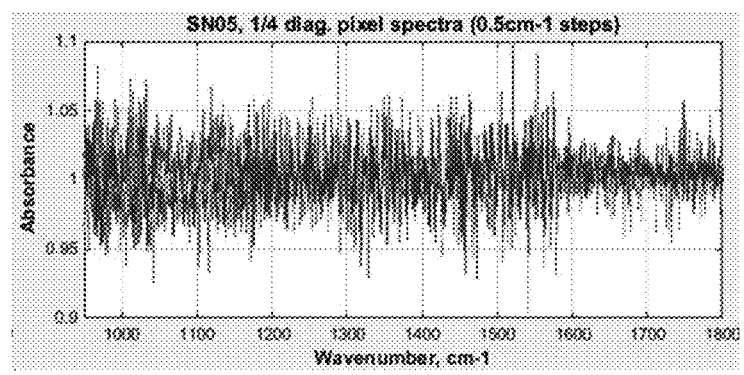
FIGS. 13A and 13B are graphs that illustrates the data from a single pixel of the image sensor versus wavenumber.
Figure 13B:
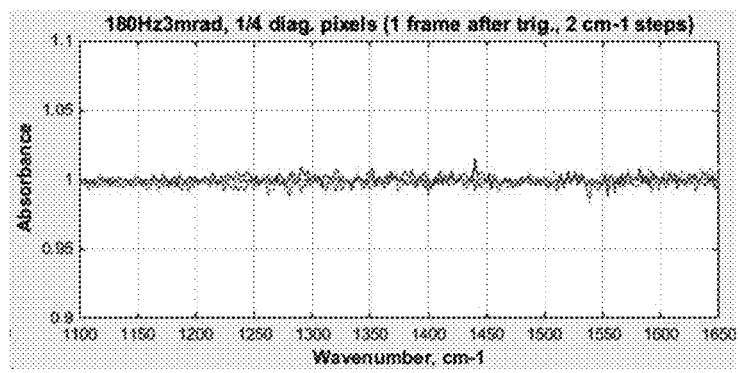

FIGS. 13A and 13B are graphs that illustrates the data from a single pixel of the image sensor 30 (illustrated in FIG. 1A) versus wavenumber. In FIG. 13A, during the acquisition of each data point, the sample 10 is illuminated at a different, target center wavenumber. Alternatively, in FIG. 13B, during the acquisition of each data point, the sample 10 is illuminated by a different beam set, with each beam set being modulation around a different, target center wavenumber. With reference to FIGS. 13A and 13B, the quality of the data is improved by modulating the wavenumber while acquiring the data.

Figure 13C:
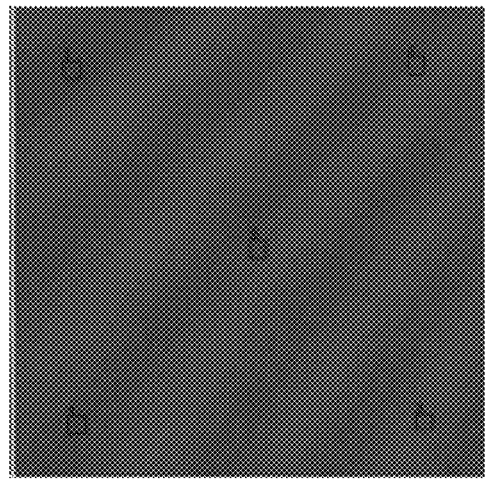
FIG. 13C is a simplified view of a mid-infrared image captured without modulation of the wavenumber.
Figure 13D:
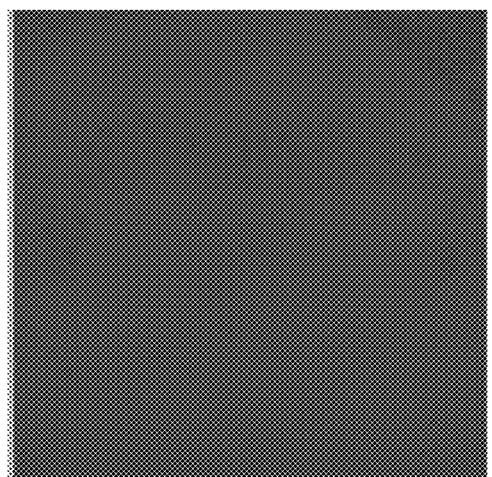
FIG. 13D is a simplified view of a mid-infrared image captured while modulating the wavenumber.

FIG. 13C is a simplified view of a mid-infrared image captured at a first target wavenumber without modulation of the wavenumber during capturing of the image, and FIG. 13D is a simplified view of a mid-infrared image captured while modulating the wavenumber about the first wavenumber. Comparing FIGS. 13C and 13D, the quality of the data is improved by modulating the wavenumber while acquiring the data.

Figure 14:
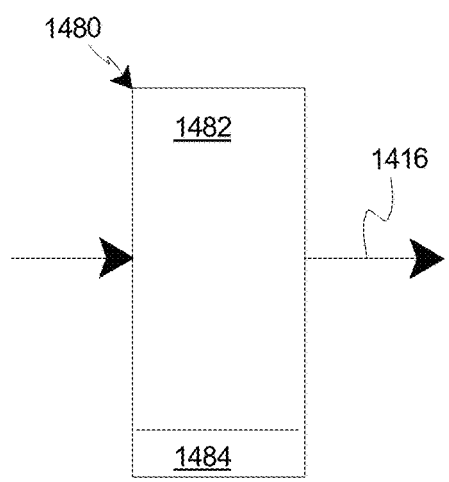
FIG. 14 is a simplified illustration of a wavelength selective assembly having features of the present invention.

It should be noted that many other variations to the spectral imaging device 12 are possible. For example, the light source 14 can be designed to include an acousto-optic modulator (AOM) instead of the mechanically displaced diffraction grating. FIG. 14 is a simplified illustrated of an AOM 1480 that can be used as the WS feedback assembly for rapidly adjusting the wavenumber of the illumination beam 1416. In this embodiment, the illumination beam 1416 is directed at the AOM 1480, and the AOM 1480 includes an infrared transparent material 1482 (e.g. Germanium) and a transducer 1484 (e.g. a piezo-electric transducer) that is attached to the transparent material 1482. With this design, the control system 1432 can direct an oscillating electric signal to the transducer 1484 that causes the transducer 1484 to vibrate the material 1482 and change the index of refraction of the material 1482. With this design, the electric signal can be rapidly changed to rapidly change the wavenumber of the illumination beam 1416. It should be noted that the AOM can provide higher modulation rates than the movable grating designed described above with reference to FIG. 1A. As provided herein, higher modulation rates allows the spectral imaging device 12 to be less susceptible to phase error and therefore will allow asynchronous and aperiodic modulation.

Still alternatively, the light source 14 can include a MEMs grating. Further, the light source 14 can have a configuration other than a Littrow configuration such as a Littman-Metcalf configuration.

As provided above, a reduction in spurious spectral artifacts in the output image can be achieved through fast source wavenumber (optical frequency) modulation and real-time detector averaging. Stated in another fashion, a reduction in noise can be achieved by rapidly tuning the light source 14 (illustrated in FIG. 1A) to generate an illumination beam 16 (illustrated in FIG. 1A) having a rapidly varying center wavenumber (optical frequency) near a target center wavenumber (optical frequency), and slowly capturing the output image with the image sensor 30 (illustrated in FIG. 1A) during the center wavenumber (optical frequency) variation. With this design, for each target center wavenumber (optical frequency), the spectral imaging device 12 can dither the target center wavenumber (optical frequency) of the illumination beam during the capture of the respective output image. As used herein, the term "optical frequency" is synonymous with the term "wavenumber".

Figure 15A:
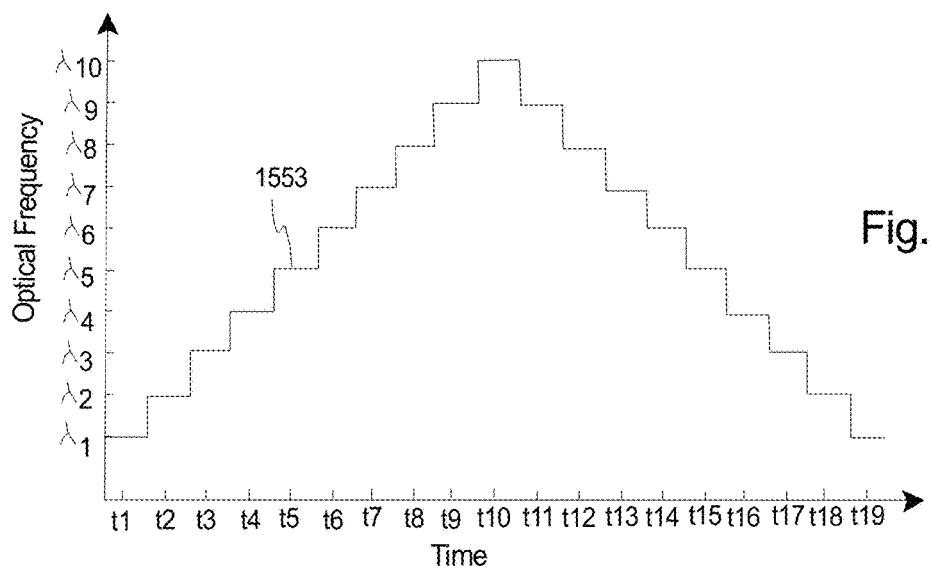
FIG. 15A is a graph that illustrates optical frequency versus time.
Figure 15B:
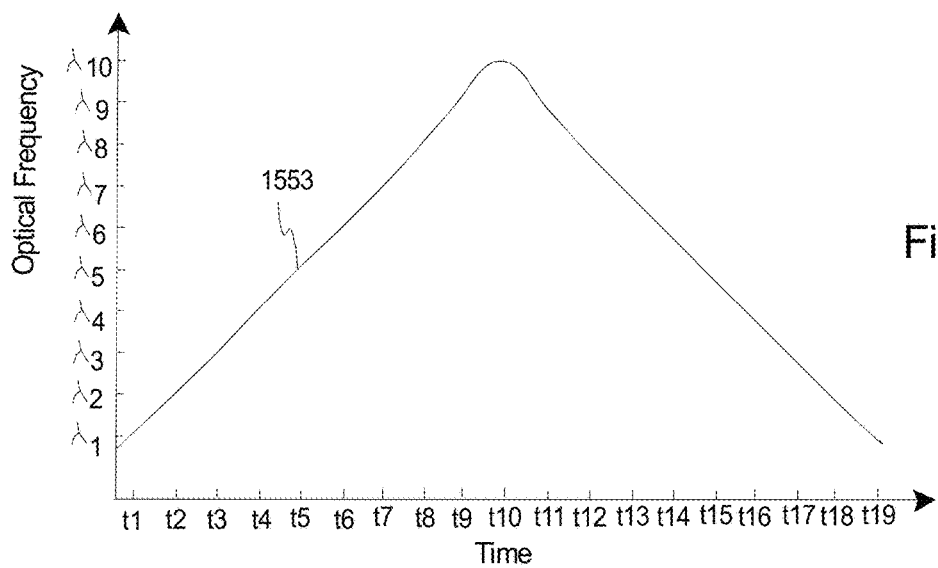
FIG. 15B is a another graph that illustrates optical frequency versus time.

FIG. 15A is a graph that illustrates wavenumber (optical frequency) versus time. As provided herein, the control system 32 (illustrated in FIG. 1A) can control the tunable light source 14 (illustrated in FIG. 1A) to generate an illumination beam 16 (illustrated in FIG. 1A) having a center target wavenumber (optical frequency) that changes in a stepped pattern from a first wavenumber (first optical frequency) to a tenth wavenumber (tenth optical frequency) and back to the first wavenumber (first optical frequency) over time. Somewhat similarly, FIG. 15B is a graph that illustrates wavenumber (optical frequency) versus time. In this example, the control system 32 (illustrated in FIG. 1A) controls the tunable light source 14 (illustrated in FIG. 1A) to generate an illumination beam 16 (illustrated in FIG. 1A) having a center target wavenumber (optical frequency) that changes in a linear fashion from the first wavenumber (first optical frequency) to the tenth wavenumber (tenth optical frequency) and back to the first wavenumber (first optical frequency) over time. It should be noted that the wavenumber (optical frequency) can be adjusted in another fashion than illustrated in FIGS. 15A and 15B.

In these examples, the first through tenth wavenumbers (optical frequencies are each within the desired tuning range of the spectral imaging device 12 (illustrated in FIG. 1A). Further, in these simplified examples, (i) at time one the illumination beam 16 has a center wavenumber (optical frequency) of one; (ii) at time two the illumination beam 16 has a center wavenumber (optical frequency) of two; (iii) at time three the illumination beam 16 has a center wavenumber (optical frequency) of three; (iv) at time four the illumination beam 16 has a center wavenumber (optical frequency) of four; (v) at time five the illumination beam 16 has a center wavenumber (optical frequency) of five; (vi) at time six the illumination beam 16 has a center wavenumber (optical frequency) of six; (vii) at time seven the illumination beam 16 has a center wavenumber (optical frequency) of seven; (viii) at time eight the illumination beam 16 has a center wavenumber (optical frequency) of eight; (ix) at time nine the illumination beam 16 has a center wavenumber (optical frequency) of nine; (x) at time ten the illumination beam 16 has a center wavenumber (optical frequency) of ten; (xi) at time eleven the illumination beam 16 has a center wavenumber (optical frequency) of nine; (xii) at time twelve the illumination beam 16 has a center wavenumber (optical frequency) of eight; (xiii) at time thirteen the illumination beam 16 has a center wavenumber (optical frequency) of seven; (xiv) at time fourteen the illumination beam 16 has a center wavenumber (optical frequency) of six; (xv) at time fifteen the illumination beam 16 has a center wavenumber (optical frequency) of five; (xvi) at time sixteen the illumination beam 16 has a center wavenumber (optical frequency) of four; (xvii) at time seventeen the illumination beam 16 has a center wavenumber (optical frequency) of three; (xviii) at time eighteen the illumination beam 16 has a center wavenumber (optical frequency) of two; and (xiv) at time nineteen the illumination beam 16 has a center wavenumber (optical frequency) of one.

It should be noted that one or more of the wavenumbers (optical frequencies) can be a target wavenumber (optical frequency) 1553. In this non-exclusive example, wavenumber (optical frequency) five is the target wavenumber (optical frequency) 1553.

Figure 15C:
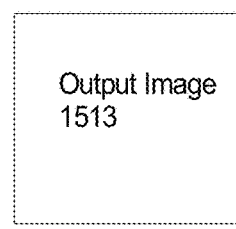
FIG. 15C illustrates an output image.

FIG. 15C illustrates an output image 1513 that is captured while the illumination beam 16 (illustrated in FIG. 1A) is cycled from the first through tenth wavenumber (optical frequency) and back from the tenth wavenumber (optical frequency) to the first wavenumber (optical frequency) for one complete cycle. In this simplified example, with reference to FIGS. 15A-15C, the spectral imaging device 12 (illustrated in FIG. 1A) is controlled to capture the output image 1513 for the target wavenumber 1553 of five while the center wavenumber of the illumination beam 16 is varied (dithered) cycled between one and ten wavenumbers. Alternatively, the tunable light source 14 can be controlled to dither the wavenumber more than one cycle during the capturing of the output image 1513. As non-exclusive examples, the number of cycles can be approximately 1, 2, 3, 4, 5, 10, 20, 40, 50, 100, or more cycles (but the desired number of cycles is more than 10) during a capture time of the image by the image sensor.

In certain embodiments, the control system 32 (illustrated in FIG. 1A) modulates the tunable light source 14 (illustrated in FIG. 1A) to generate a set of discrete modulation wavenumbers (optical frequencies) near a target wavenumber to produce a maximum wavenumber (optical frequency) modulation, $\Delta v_{modulation}$, about the target wavenumber (optical frequency) set point which satisfies the following prescription: $\Delta v_{modulation} = \pm \eta \Delta v/2$, where n is a constant having a value of greater than or equal to 0.1 and less than or equal to 100, and $\Delta v$ is the desired spectral resolution. Further, in this embodiment, the image sensor 30 (illustrated in FIG. 1A) captures the output image during a capture time that is greater than the frequency modulation.

As a non-exclusive examples, the amount of dithering about the target wavenumber (optical frequency) of the modulation wavenumbers (optical frequencies) during the capture time can be approximately plus or minus 0.1, 0.25, 0.33, 0.5, 1, 2, 3, 4, 5, 6, 7, 10, or more $cm^{-1}$ wavenumbers.

In summary, the control system can modulate the tunable light source to generate a set of discrete modulation wavenumbers (optical frequencies) about and through a target wavenumber (optical frequency) with a wavenumber (optical frequency) modulation rate, and the image sensor can be controlled to capture the target output image during a capture time that is longer than the inverse of the wavenumber (optical frequency) modulation rate.

Figure 16:
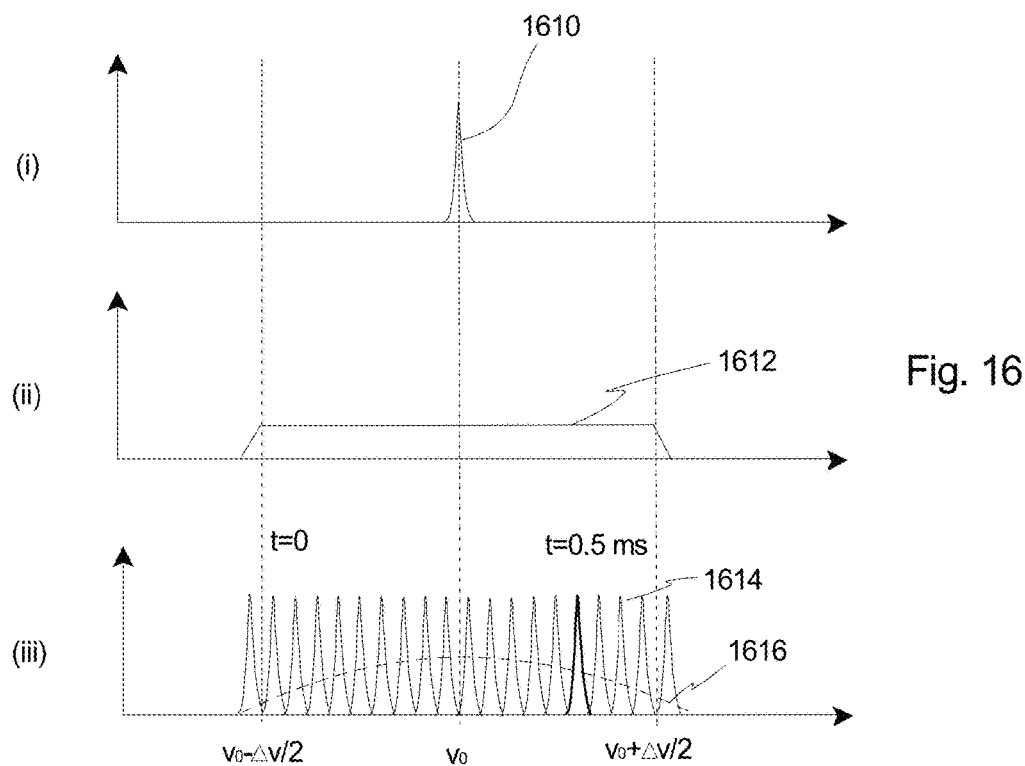
FIG. 16 includes an upper graph with an illustration of a narrow optical frequency distribution, a middle graph with an illustration of a very broad optical frequency distribution of an output beam, and a lower graph having a schematic illustration of a plurality of narrow optical frequency pulses of energy generated in a relatively short period of time and the dashed line showing the time-averaged optical frequency of the series of pulses.

FIG. 16 includes (i) an upper graph 1610 having a schematic illustration of a narrow optical frequency distribution (line with narrower than the interference that we are trying to ignore) of a typical laser output beam; (ii) a middle graph 1612 having a schematic illustration of a very broad optical frequency distribution of an output beam (an ideally broadened laser line to be approximate a top hat); and (iii) a lower graph 1614 having a schematic illustration of a plurality of narrow optical frequency pulses of energy generated in a relatively short period of time (a laser line whose center value is shifted over time in time to produce a desired time-averaged optical frequency distribution which fills the spectral band $\Delta v$). Thus, provided herein, the output of the laser source can be extrinsically broadened using dynamic optical frequency modulation of laser line (dithering the laser) to produce the desired, time-averaged optical frequency distribution 1616 (dashed line).

Thus, as provided herein, the modulation of the parasitic etalons can be filtered by fast wavenumber (optical frequency) modulation of the laser source and real-time detector averaging. This has an effect of averaging out the parasitic etalons and improving the resulting image quality and spectral fidelity. This embodiment has a distinct advantage in live video discrete frequency imaging with coherent illumination since it is becomes unnecessary to acquire multiple frames at different wavenumbers (optical frequencies) and the implementation of digital signal processing to remove the noise. In many instances, the features of interest are broader than a narrow line width. Additionally, the parasitic etalons can be finer than the features of interest. Thus, it can be advantageous to average the unwanted spectral noise that manifests itself as a fringe pattern in the spatial domain by using a broad optical frequency (e.g. modulate optical frequency over time). This can be done with either a CW laser or a pulsed laser.

Figure 17A:
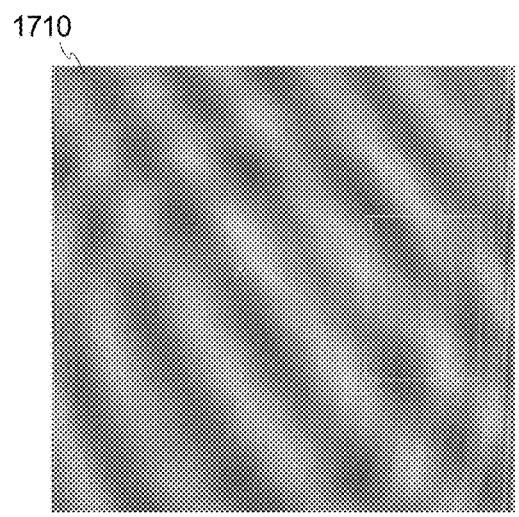
FIG. 17A is an image captured without noise reduction methods provided herein.

FIG. 17A is an image 1710 captured without noise reduction methods provided herein. It should be noted that this image 1710 includes a plurality of fringes that adversely influence the quality of the image 1710.

Figure 17B:
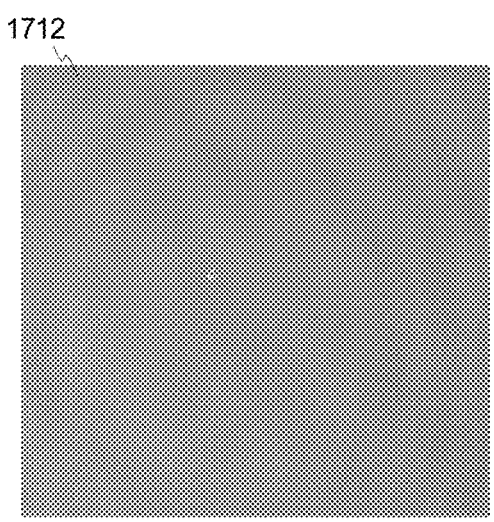
FIG. 17B is a captured image using the spectral image device provided herein.

FIG. 17B is a captured image 1712 using the spectral image device 12 provided herein. The image 1712 of FIG. 17B is less influenced by the fringes.

It is understood that although a number of different embodiments of the spectral imaging device 12 have been illustrated and described herein, one or more features of any one embodiment can be combined with one or more features of one or more of the other embodiments, provided that such combination satisfies the intent of the present invention.

While the particular spectral imaging device 12 as herein shown and disclosed in detail is fully capable of obtaining the objects and providing the advantages herein before stated, it is to be understood that it is merely illustrative of some of the presently preferred embodiments of the invention and that no limitations are intended to the details of construction or design herein shown other than as described in the appended claims.

What is claimed is:

1. A spectral imaging device for generating an image of a sample, the spectral imaging device comprising:
an image sensor that captures information of the image;
a tunable light source that generates an illumination beam that is directed at the sample;
an optical assembly that collects light from the sample and images the light on the image sensor; and
a control system that controls the tunable light source and the image sensor, the control system including a processor; wherein, during a first time segment, the control system (i) controls the tunable light source so that the illumination beam includes a first beam set in which a center wavenumber of the illumination beam is modulated at least one, first cycle from a first wavenumber through a first target wavenumber to a second wavenumber, and back through the first target wavenumber to the first wavenumber with a first modulation rate; and (ii) controls the image sensor to capture a first image at a first frame rate; wherein the first image is accumulated while the center wavenumber is being modulated the at least one, first cycle; wherein the first modulation rate is equal to or greater than the first frame rate; wherein a difference between the first wavenumber and the second wavenumber is at least one wavenumber.

2. The spectral imaging device of claim 1 wherein the first modulation rate is approximately an integer multiple of the first frame rate.

3. The spectral imaging device of claim 2 wherein, during a second time segment that is different from the first time segment, the control system (iii) controls the tunable light source so that the illumination beam includes a second beam set in which the center wavenumber of the illumination beam is modulated at least one, second cycle from a third wavenumber through a second target wavenumber to a fourth wavenumber, and back through the second target wavenumber to the third wavenumber with a second modulation rate; and (iv) controls the image sensor to capture a second image at a second frame rate; wherein the second image is accumulated while the center wavenumber is being modulated the at least one, second cycle; wherein the second modulation rate is approximately an integer multiple of the second frame rate; and wherein the second target wavenumber is different from the first target wavenumber; wherein a difference between the third wavenumber and the fourth wavenumber is at least one wavenumber.

4. The spectral imaging device of claim 3 wherein, during a third time segment that is different from the first time segment and the second time segment, the control system (v) controls the tunable light source so that the illumination beam includes a third beam set in which the center wavenumber of the illumination beam is modulated at least one, third cycle from a fifth wavenumber through a third target wavenumber to a sixth wavenumber, and back through the third target wavenumber to the fifth wavenumber with a third modulation rate; and (vi) controls the image sensor to capture a third image at a third frame rate; wherein the third image is accumulated while the center wavenumber is being modulated the at least one, third cycle; wherein the third modulation rate is approximately an integer multiple of the third frame rate; and wherein the third target wavenumber is different from the first target wavenumber and the second target wavenumber; wherein a difference between the fifth wavenumber and the sixth wavenumber is at least one wavenumber.

5. The spectral imaging device of claim 3 wherein the first target wavenumber and the second target wavenumber are spaced apart a wavenumber step; wherein the first beam set has a first peak-to-trough value, and the second beam set has a second peak-to-trough value; and wherein the first peak-to-trough value and the second peak-to-trough value are greater than or equal to fifty percent of the wavenumber step.

6. The spectral imaging device of claim 1 wherein during the first time segment period, the control system controls the image sensor to capture at least two, first images.

7. The spectral imaging device of claim 1 wherein the control system includes a light source clock and an imaging sensor clock, and wherein the light source clock generates a plurality of source signals that are directed to the sensor clock so that the sensor clock is phase locked to the light source clock such that the sensor clock is the slave and the light source clock is the master.

8. The spectral imaging device of claim 1, wherein the control system includes a light source clock and an imaging sensor clock, and wherein the imaging sensor clock generates a plurality of sensor signals that are directed to the light source clock so that the light source clock is phase locked to the imaging sensor clock such that the light source clock is the slave and the imaging sensor clock is the master.

9. The spectral imaging device of claim 8 wherein the control system includes a frame grabber that receives at least one first image, and time stamps at least one first image with the time from the light source clock.

10. The spectral imaging device of claim 1 wherein the image sensor includes a two-dimensional array of sensors that are used to construct a two-dimensional image.

11. A method for generating an image of a sample comprising:
   capturing information of the image with an image sensor;
   directing an illumination beam at the sample with a tunable light source;
   collecting light from the sample and forming the image on the image sensor with an optical assembly;
   controlling the tunable light source during a first time segment so that the illumination beam includes a first beam set in which a center wavenumber of the illumination beam is modulated at least one, first cycle from a first wavenumber through a first target wavenumber to a second wavenumber, and back through the first target wavenumber to the first wavenumber with a first modulation rate; wherein a difference between the first wavenumber and the second wavenumber is at least one wavenumber; and
   controlling the image sensor to capture a first image at a first frame rate during the first time segment; wherein the first image is accumulated while the center wavenumber is being modulated the at least one, first cycle; wherein the first modulation rate is equal to or greater than the first frame rate.

12. The method of claim 11 wherein the first modulation rate is approximately an integer multiple of the first frame rate.

13. The method of claim 12 further including (i) controlling the tunable light source during a second time segment so that the illumination beam includes a second beam set in which the center wavenumber of the illumination beam is modulated at least one, second cycle from a third wavenumber through a second target wavenumber to a fourth wavenumber, and back through the second target wavenumber to the third wavenumber with a second modulation rate; and (ii) controlling the image sensor to capture a second image at a second frame rate during the second time segment; wherein the second image is accumulated while the center wavenumber is being modulated the at least one, second cycle; wherein the second modulation rate is approximately an integer multiple of the second frame rate; wherein a difference between the third wavenumber and the fourth wavenumber is at least one wavenumber; and wherein the second target wavenumber is different from the first target wavenumber.

14. The method of claim 13 further including (iii) controlling the tunable light source during a third time segment so that the illumination beam includes a third beam set in which the center wavenumber of the illumination beam is modulated at least one, third cycle from a fifth wavenumber through a third target wavenumber to a sixth wavenumber, and back through the third target wavenumber to the fifth wavenumber with a third modulation rate; and (iv) controlling the image sensor to capture a third image at a third frame rate during the third time segment; wherein the third image is accumulated while the center wavenumber is being modulated the at least one, third cycle; wherein the third modulation rate is approximately an integer multiple of the third frame rate; wherein a difference between the fifth wavenumber and the sixth wavenumber is at least one wavenumber; and wherein the third target wavenumber is different from the first target wavenumber and the second target wavenumber.

15. The method of claim 13 wherein the first target wavenumber and the second target wavenumber are spaced apart a wavenumber step; wherein the first beam set has a first peak-to-trough value, and the second beam set has a second peak-to-trough value; and wherein the first peak-to-trough value and the second peak-to-trough value are greater than or equal to fifty percent of the wavenumber step.

16. The method of claim 11 wherein during the first time segment, the image sensor is controlled to capture at least two, first images.

17. The method of claim 11 further including generating a plurality of source signals with a light source clock that are directed to a sensor clock so that the sensor clock is phase locked to the light source clock such that the sensor clock is the slave and the light source clock is the master.

18. The method of claim 11 further including generating a plurality of sensor signals with a sensor clock that are directed to a light source clock so that the light source clock is phase locked to the sensor clock such that the light source clock is the slave and the sensor clock is the master.

19. The method of claim 18 further including a frame grabber that receives at least one first image, and time stamps at least one first image with the time from the light source clock.

20. The method of claim 11 wherein the step of capturing information includes the image sensor having a two-dimensional array of sensors that are used to construct a two-dimensional image.

* * * * *

UNITED STATES PATENT AND TRADEMARK OFFICE
CERTIFICATE OF CORRECTION

PATENT NO. : 10,437,033 B2
APPLICATION NO. : 15/840476
DATED : October 8, 2019
INVENTOR(S) : Jeremy Rowlette et al.

It is certified that error appears in the above-identified patent and that said Letters Patent is hereby corrected as shown below:

On the Title Page

Column 1, Line 5 at Page 3, References Cited / Other Publications, insert --the Optical Society of America, American Institute of Physics, New York, US, vol. 61, no. 7, 1 July 1971, pages 847-851.-- after "Journal of".

Signed and Sealed this
Seventeenth Day of March, 2020

Andrei Iancu
*Director of the United States Patent and Trademark Office*